US009720315B2

(12) United States Patent
Hamamoto et al.

(10) Patent No.: US 9,720,315 B2
(45) Date of Patent: Aug. 1, 2017

(54) REFLECTIVE MASK BLANK, METHOD OF MANUFACTURING REFLECTIVE MASK BLANK, REFLECTIVE MASK AND METHOD OF MANUFACTURING SEMICONDUCTOR DEVICE

(71) Applicant: HOYA CORPORATION, Tokyo (JP)

(72) Inventors: Kazuhiro Hamamoto, Tokyo (JP); Tatsuo Asakawa, Tokyo (JP); Tsutomu Shoki, Tokyo (JP)

(73) Assignee: Hoya Corporation, Tokyo (JP)

( * ) Notice: Subject to any disclaimer, the term of this patent is extended or adjusted under 35 U.S.C. 154(b) by 78 days.

(21) Appl. No.: 14/787,497

(22) PCT Filed: Aug. 29, 2014

(86) PCT No.: PCT/JP2014/072688
§ 371 (c)(1),
(2) Date: Oct. 28, 2015

(87) PCT Pub. No.: WO2015/030159
PCT Pub. Date: Mar. 5, 2015

(65) Prior Publication Data
US 2016/0161837 A1 Jun. 9, 2016

(30) Foreign Application Priority Data
Aug. 30, 2013 (JP) .................................. 2013-179123

(51) Int. Cl.
*G03F 1/24* (2012.01)
*G03F 1/50* (2012.01)
*G03F 7/20* (2006.01)

(52) U.S. Cl.
CPC .............. *G03F 1/24* (2013.01); *G03F 7/2004* (2013.01)

(58) Field of Classification Search
None
See application file for complete search history.

(56) References Cited

U.S. PATENT DOCUMENTS

| 7,220,690 B2 | 5/2007 | Mitra et al. |
| 7,998,645 B2 | 8/2011 | Otsuka et al. |
| (Continued) | | |

FOREIGN PATENT DOCUMENTS

| JP | 2005-231994 A | 9/2005 |
| JP | 2006-176341 A | 7/2006 |
| (Continued) | | |

OTHER PUBLICATIONS

International Search Report for PCT/JP2014/072688 dated Nov. 25, 2014.
(Continued)

*Primary Examiner* — Stephen Rosasco
(74) *Attorney, Agent, or Firm* — Sughrue Mion, PLLC

(57) ABSTRACT

Provided is a reflective mask blank capable of facilitating the discovery of contaminants, scratches and other critical defects by inhibiting the detection of pseudo defects attributable to surface roughness of a substrate or film in a defect inspection using a highly sensitive defect inspection apparatus. The reflective mask blank has a mask blank multilayer film comprising a multilayer reflective film, obtained by alternately laminating a high refractive index layer and a low refractive index layer, and an absorber film on a main surface of a mask blank substrate, wherein the root mean square roughness (Rms), obtained by measuring a 3 μm×3 μm region on the surface of the reflective mask blank on which the mask blank multilayer film is formed with an atomic force microscope, is not more than 0.5 nm and the power spectrum density at a spatial frequency of 1 $\mu m^{-1}$ to 10 $\mu m^{-1}$ is not more than 50 $nm^4$.

18 Claims, 3 Drawing Sheets

(56) References Cited

U.S. PATENT DOCUMENTS

| | | |
|---|---|---|
| 8,241,821 B2 | 8/2012 | Ikuta |
| 8,460,843 B2 | 6/2013 | Otsuka et al. |
| 2005/0197242 A1 | 9/2005 | Mitra et al. |
| 2008/0132150 A1 | 6/2008 | Arserio et al. |
| 2011/0165504 A1 | 7/2011 | Ikuta |
| 2011/0281069 A1 | 11/2011 | Otsuka et al. |

FOREIGN PATENT DOCUMENTS

| | | |
|---|---|---|
| JP | 2007-311758 A | 11/2007 |
| JP | 2008-094649 A | 4/2008 |
| JP | 2008-156215 A | 7/2008 |
| JP | 2008-201665 A | 9/2008 |
| JP | 2009-510711 A | 3/2009 |
| KR | 10-2011-0065439 A | 6/2011 |
| WO | 2013/084978 A1 | 6/2013 |

OTHER PUBLICATIONS

Communication dated Mar. 2, 2017, issued by the Korean Intellectual Property Office in corresponding Korean Application No. 10-2015-7031307.

(a)

(b)

REFLECTIVE MASK BLANK, METHOD OF MANUFACTURING REFLECTIVE MASK BLANK, REFLECTIVE MASK AND METHOD OF MANUFACTURING SEMICONDUCTOR DEVICE

CROSS REFERENCE TO RELATED APPLICATIONS

This application is a National Stage of International Application No. PCT/JP2014/072688 filed Aug. 29, 2014, claiming priority based on Japanese Patent Application No. 2013-179123 filed Aug. 30, 2013, the contents of all of which are incorporated herein by reference in their entirety.

TECHNICAL FIELD

The present invention relates to a reflective mask blank that is able to facilitate discovery of contaminants or scratches and other critical defects by inhibiting detection of pseudo defects attributable to surface roughness of a substrate or film in a defect inspection using a highly sensitive defect inspection apparatus, a method of manufacturing the reflective mask blank, a reflective mask and a method of manufacturing a semiconductor device.

BACKGROUND ART

Accompanying the increasingly higher levels of integration of semiconductor devices in the semiconductor industry in recent years, there is a need for fine patterns that exceed the transfer limitations of conventional photolithography methods using ultraviolet light. Extreme ultraviolet (EUV) lithography is considered to be promising as an exposure technology that uses EUV light to enable the formation of such fine patterns. Here, EUV light refers to light in the wavelength band of the soft X-ray region or vacuum ultraviolet region, and more specifically, light having a wavelength of about 0.2 nm to 100 nm. Reflective masks have been proposed as transfer masks for use in this EUV lithography. Such reflective masks have a multilayer reflective film that reflects exposure light formed on a substrate, and an absorber film formed in a pattern on the multilayer reflective film that absorbs exposure light.

The reflective mask is manufactured from a substrate, a multilayer reflective film formed on the substrate, and a reflective mask blank having an absorber film formed on the multilayer reflective film, by forming an absorber film pattern by photolithography and the like.

As has been described above, due to the growing demand for miniaturization in the lithography process, significant problems are being encountered in the lithography process. One of these is the problem relating to defect information of mask blank substrates, substrates with multilayer reflective films and reflective mask blanks and the like used in the lithography process.

Mask blank substrates are being required to have even higher smoothness from the viewpoints of improving defect quality accompanying the miniaturization of patterns in recent years and the optical properties required of transfer masks.

In addition, substrates with multilayer reflective films are also being required to have even higher smoothness from the viewpoints of improving defect quality accompanying the miniaturization of patterns in recent years and the optical properties required of transfer masks. Multilayer reflective films are formed by alternately laminating layers having a high refractive index and layers having a low refractive index on the surface of a mask blank substrate. Each of these layers is typically formed by sputtering using sputtering targets composed of the materials that form these layers.

Ion beam sputtering is preferably carried out for the sputtering method from the viewpoint of not requiring the generation of plasma by electrical discharge and being resistant to contamination by impurities present in the multilayer reflective film, and from the viewpoint of having an independent ion source thereby making setting of conditions comparatively easy. In addition, from the viewpoint of the smoothness and surface uniformity of each layer formed, the high refractive index layer and low refractive index layer are deposited by allowing sputtered particles to reach the target at a large angle with respect to the normal (line perpendicular to the main surface of the mask blank substrate) of a main surface of the mask blank substrate, or in other words, at an angle diagonal or nearly parallel to a main surface of the substrate.

Patent Literature 1 describes a technology for manufacturing a substrate with a multilayer reflective film using such a method in which, when depositing a multilayer reflective film of a reflective mask blank for EUV lithography on a substrate, ion beam sputtering is carried out by maintaining the absolute value of an angle $\alpha$ formed between the normal of the substrate and sputtered particles entering the substrate such that 35 degrees$\leq\alpha\leq$80 degrees while rotating the substrate about the central axis thereof.

In addition, Patent Literature 2 describes a reflective mask blank for EUV lithography in which an absorber layer that absorbs EUV light contains Ta, B, Si and N, the content of B is not less than 1 at % to less than 5 at %, the content of Si is 1 at % to 25 at %, and the composition ratio between Ta and N (Ta:N) is 8:1 to 1:1.

PRIOR ART LITERATURE

Patent Literature

Patent Literature 1: JP 2009-510711A
Patent Literature 2: JP 2007-311758A

DISCLOSURE OF THE INVENTION

Problems to be Solved by the Invention

Accompanying the rapid pace of pattern miniaturization in lithography using EUV light, the defect size of reflective masks in the form of EUV masks is becoming increasingly smaller year by year, and the inspection light source wavelengths used during defect inspections in order to discover such fine defects are approaching the light source wavelength of the exposure light.

For example, highly sensitive defect inspection apparatuses having an inspection wavelength of 266 nm (such as the "MAGICS M7360" Mask/Substrate/Blank Defect Inspection Apparatus for EUV Exposure manufactured by Lasertec Corp.), an inspection wavelength of 193 nm (such as the "Teron 610" of "Teron 600 Series", EUV Mask/Blank Defect Inspection Apparatuses manufactured by KLA-Tencor Corp.), or an inspection wavelength of 13.5 nm are being used or proposed increasingly frequently as defect inspection apparatuses of EUV masks and masters thereof in the form EUV mask blanks, substrates with multilayer reflective film and substrates.

In addition, in the case of multilayer reflective films of substrates with multilayer reflective films used in conventional EUV masks, attempts have been made to reduce concave defects present on the substrate by depositing according to, for example, the method described in Patent Literature 1. However, no matter how much defects attributable to concave defects in a substrate are able to be reduced, due to the high detection sensitivity of the aforementioned highly sensitive defect detection apparatuses, there is still the problem of the number of detected defects (number of detected defects=number of critical defects+ number of pseudo defects) being excessively large when a defect inspection is carried out on the multilayer reflective film.

In addition, problems in terms of depositing the absorber layer (absorber film) and problems with the reflectance of EUV light or inspection light have been attempted to be solved by employing a composition ratio like that described in Patent Literature 2, for example, for the absorber layer of a reflective mask blank used in conventional EUV masks. With respect to surface roughness of the surface of the absorber layer as well, smoothing is considered to be favorable from the viewpoint of preventing exacerbation of pattern dimensional accuracy. However, no matter how much deposition problems of the absorber layer are able to be resolved, if a defect inspection is carried out on an absorber layer using a highly sensitive defect inspection apparatus having high detection sensitivity as previously described, the problem results in which an excessively large number of defects are detected.

Pseudo defects as mentioned here refer to surface irregularities that are permitted to be present on a substrate surface, multilayer reflective film or absorber layer and do not have an effect on pattern transfer, and end up being incorrectly assessed as defects in the case of having been inspected with a highly sensitive defect inspection apparatus. If a large number of such pseudo defects are detected in a defect inspection, critical defects that have an effect on pattern transfer end up being concealed by the large number of pseudo defects, thereby preventing critical defects from being discovered. For example, in the case of currently popular defect inspection apparatuses having an inspection light source wavelength of 266 nm or 193 nm, more than 50,000 defects end up being detected in a substrate, substrate with a multilayer reflective film or reflective mask blank having a size of, for example, 132 mm×132 mm, thereby obstructing inspections for the presence of critical defects. Overlooking critical defects in a defect inspection results in defective quality in the subsequent semiconductor device volume production process and leads to unnecessary labor and economic losses.

With the foregoing in view, an object of the present invention is to provide a reflective mask blank that is able to facilitate discovery of contaminants or scratches and other critical defects by inhibiting detection of pseudo defects attributable to surface roughness of a substrate or film in a defect inspection using a highly sensitive defect inspection apparatus, a method of manufacturing the reflective mask blank, a reflective mask and a method of manufacturing a semiconductor device that uses that reflective mask.

In addition, an object of the present invention is to provide a reflective mask blank that enables critical defects to be reliably detected since the number of detected defects, including pseudo defects, is reduced even when using highly sensitive defect inspection apparatuses that use light of various wavelengths, and achieves smoothness required by reflective mask blanks in particular while simultaneously reducing the number of detected defects, including pseudo defects, a method of manufacturing that reflective mask blank, a reflective mask and a method of manufacturing a semiconductor device that uses that reflective mask.

Means for Solving the Problems

As a result of conducting extensive studies to solve the aforementioned problems, the inventors of the present invention found that the roughness of a prescribed spatial frequency (or spatial wavelength) component has an effect on the inspection light source wavelength of a highly sensitive defect inspection apparatus. Therefore, by specifying the spatial frequency of a roughness component at which a highly sensitive defect inspection apparatus ends up incorrectly assessing a defect as a pseudo defect among roughness (surface irregularity) components on the surface of a film (such as an absorber film) formed on a main surface of a substrate, and managing amplitude intensity at that spatial frequency, detection of pseudo defects in a defect inspection can be inhibited and critical defects can be made more conspicuous.

In addition, although attempts have been made to reduce the surface roughness of reflective mask blanks in the past, there is no known correlation whatsoever with the detection of pseudo defects by highly sensitive defect inspection apparatuses.

Therefore, the present invention has the configurations indicated below in order to solve the aforementioned problems.

The present invention is a reflective mask blank characterized by the following Configurations 1 to 6, a method of manufacturing a reflective mask blank characterized by the following Configurations 7 to 16, a reflective mask characterized by the following Configuration 17, and a method of manufacturing a semiconductor device characterized by the following Configuration 18.

(Configuration 1)

Configuration 1 of the present invention is a reflective mask blank, comprising: a mask blank multilayer film that comprises a multilayer reflective film, obtained by alternately laminating a high refractive index layer and a low refractive index layer, and an absorber film on or above a main surface of a mask blank substrate; wherein, the root mean square roughness (Rms), obtained by measuring a 3 μm×3 μm region on a surface of the reflective mask blank on which the mask blank multilayer film is formed with an atomic force microscope, is not more than 0.5 nm and the power spectrum density at a spatial frequency of 1 μm$^{-1}$ to 10 μm$^{-1}$ is not more than 50 nm$^4$.

According to Configuration 1, by making the root mean square roughness (Rms) on the surface of the reflective mask blank to be not more than 0.5 nm, and by making the power spectrum density, which is the amplitude intensity of all roughness components detectable in a 3 μm×3 μm region at a spatial frequency of 1 μm$^{-1}$ to 10 μm$^{-1}$, to be not more than 50 nm$^4$, detection of pseudo defects in a defect inspection using a highly sensitive defect inspection apparatus can be inhibited while making critical defects more conspicuous.

(Configuration 2)

Configuration 2 of the present invention is the reflective mask blank described in Configuration 1, wherein the mask blank multilayer film further comprises a protective film arranged in contact with a surface of the multilayer reflective film on the opposite side from the mask blank substrate.

According to Configuration 2, since damage to the surface of the multilayer reflective film can be inhibited when fabricating a transfer mask (EUV mask) as a result of the reflective mask blank having a protective film on the multilayer reflective film, reflectance properties with respect to EUV light can be further improved. In addition, in a reflective mask blank, since detection of pseudo defects in a defect inspection of the surface of the protective film using a highly sensitive defect inspection apparatus can be inhibited, critical defects can be made to be more conspicuous.

(Configuration 3)

Configuration 3 of the present invention is the reflective mask blank described in Configuration 1 or Configuration 2, wherein the mask blank multilayer film further comprises an etching mask film arranged in contact with the surface of the absorber film on the opposite side from the mask blank substrate.

According to Configuration 3, by using an etching mask film having different dry etching properties from those of the absorber film, a highly precise transfer pattern can be formed when forming a transfer pattern on the absorber film.

(Configuration 4)

Configuration 4 of the present invention is the reflective mask blank described in any of Configurations 1 to 3, wherein the absorber film comprises tantalum and nitrogen, and the nitrogen content is 10 at % to 50 at %.

According to Configuration 4, as a result of the absorber film comprising tantalum and nitrogen and the nitrogen content thereof being 10 at % to 50 at %, the root mean square roughness (Rms) of the surface of the absorber film, and the power spectrum density, which is the amplitude intensity of all roughness components detectable in a 3 μm×3 μm region at a spatial frequency of 1 μm$^{-1}$ to 10 μm$^{-1}$, are within the prescribed ranges, and pattern edge roughness when patterning the absorber film can be reduced since enlargement of crystal grains composing the absorber film can be inhibited.

(Configuration 5)

Configuration 5 of the present invention is the reflective mask blank described in any of Configurations 1 to 4, wherein the film thickness of the absorber film is not more than 60 nm.

According to Configuration 5, by making the film thickness of the absorber film to be not more than 60 nm, in addition to being able to reduce shadowing effects, the root mean square roughness (Rms) of the surface of the absorber film, and the power spectrum density, which is the amplitude intensity of all roughness components detectable in a 3 μm×3 μm region at a spatial frequency of 1 μm$^{-1}$ to 10 μm$^{-1}$, can be further reduced. As a result thereof, a reflective mask blank is obtained that is able to inhibit the detection of pseudo defects in a defect inspection using a highly sensitive defect inspection apparatus.

(Configuration 6)

Configuration 6 of the present invention is the reflective mask blank described in any of Configurations 1 to 5, wherein the absorber film has a phase shift function by which the phase difference between light reflected from the surface of the absorber film and light reflected from the surface of the multilayer reflective film or protective film where the absorber film is not formed has a prescribed phase difference.

According to Configuration 6, as a result of the absorber film having a function by which the phase difference between reflected light from the surface of the absorber film and reflected light from the surface of the multilayer reflective film or protective film where the absorber film is not formed has a prescribed phase difference, a master for a reflective mask in the form of a reflective mask blank is obtained that demonstrates improved transfer resolution by EUV light. In addition, since the film thickness of the absorber film required to demonstrate phase shift effects needed to obtain a desired transfer resolution can be reduced in comparison with the prior art, a reflective mask blank is obtained that exhibits reduced shadowing effects.

(Configuration 7)

Configuration 7 of the present invention is a method of manufacturing a reflective mask blank having a mask blank multilayer film, comprising a multilayer reflective film and an absorber film on or above a main surface of a mask blank substrate, wherein a multilayer reflective film is obtained by alternately laminating a high refractive index layer and a low refractive index layer, the method comprising: forming the multilayer reflective film on or above the main surface of the mask blank substrate, and forming the absorber film on or above the multilayer reflective film; wherein, the absorber film is formed so that a surface of the reflective mask blank has a root mean square roughness (Rms), obtained by measuring a 3 μm×3 μm region with an atomic force microscope, of not more than 0.5 nm and a power spectrum density at a spatial frequency of 1 μm$^{-1}$ to 10 μm$^{-1}$ of not more than 50 nm$^4$.

According to Configuration 7, as a result of making the surface of a reflective mask blank to have an Rms of not more than 0.5 nm and the power spectrum density, which is the amplitude intensity of all roughness components detectable in a 3 μm×3 μm region at a spatial frequency of 1 μm$^{-1}$ to 10 μm$^{-1}$, of not more than 50 nm$^4$, a reflective mask blank can be fabricated that is capable of inhibiting the detection of pseudo defects in a defect inspection using a highly sensitive defect inspection apparatus and making critical defects more conspicuous.

(Configuration 8)

Configuration 8 of the present invention is the method of manufacturing a reflective mask blank described in Configuration 7, wherein, when the multilayer reflective film is formed, the multilayer reflective film is formed by ion beam sputtering by alternately irradiating a sputtering target of a high refractive index material and a sputtering target of a low refractive index material with an ion beam.

According to Configuration 8, as a result of forming a multilayer reflective film by a prescribed ion beam sputtering method in the step for forming a multilayer reflective film, a multilayer reflective film can be reliably obtained having favorable reflectance properties with respect to EUV light.

(Configuration 9)

Configuration 9 of the present invention is the method of manufacturing a reflective mask blank described in Configuration 7 or Configuration 8, wherein, when the absorber film is formed, the absorber film is formed by reactive sputtering using a sputtering target of an absorber film material, the absorber film is formed so as to contain a component contained in the atmospheric gas during reactive sputtering, and the flow rate of the atmospheric gas is controlled so that the root mean square roughness (Rms) is not more than 0.5 nm and the power spectrum density is not more than 50 nm$^4$.

According to Configuration 9, an absorber film having a prescribed composition can be obtained by forming the absorber film by reactive sputtering in the step for forming the absorber film. As a result of adjusting the flow rate of atmospheric gas when depositing by reactive sputtering, the root mean square roughness (Rms) of the surface of the mask blank multilayer film containing the absorber film, and the power spectrum density, which is the amplitude intensity of all roughness components detectable in a 3 μm×3 μm region at a spatial frequency of 1 $\mu m^{-1}$ to 10 $\mu m^{-1}$, can be adjusted to be within a prescribed range of values.

(Configuration 10)

Configuration 10 of the present invention is the method of manufacturing a reflective mask blank described in Configuration 9, wherein the atmospheric gas is a mixed gas containing an inert gas and nitrogen gas.

According to Configuration 10, an absorber film that has a suitable composition can be obtained, since the nitrogen flow rate can be adjusted as a result of the atmospheric gas during formation of the absorber film by reactive sputtering being a mixed gas containing an inert gas and nitrogen. As a result thereof, an absorber film can be reliably obtained that has a suitable root mean square roughness (Rms) and power spectrum density on the surface of a mask blank multilayer film.

(Configuration 11)

Configuration 11 of the present invention is the method of manufacturing a reflective mask blank described in any of Configurations 7 to 10, wherein the absorber film is formed using a sputtering target of a material containing tantalum.

According to Configuration 11, as a result of forming the absorber film using a sputtering target of a material containing tantalum when forming the absorber film by reactive sputtering, an absorber film can be formed that contains tantalum and has suitable absorption. In addition, an absorber film having a suitable root mean square roughness (Rms) and power spectrum density on the surface of a mask blank multilayer film can be more reliably obtained.

(Configuration 12)

Configuration 12 of the present invention is the method of manufacturing a reflective mask blank described in Configuration 7 or Configuration 8, wherein, when the absorber film is formed, the absorber film is formed by sputtering using a sputtering target of a material of the absorber film, and the material and film thickness of the absorber film are selected so that the surface of the absorber film has a root mean square roughness (Rms) of not more than 0.5 nm and a power spectrum density at a spatial frequency of 1 $\mu m^{-1}$ to 10 $\mu m^{-1}$ of not more than 50 $nm^4$.

According to Configuration 12, as a result of selecting the material and film thickness of the absorber film in the step for forming an absorber film, the root mean square roughness (Rms) of the surface of a mask blank multilayer film containing the absorber film, and the power spectrum density, which is the amplitude intensity of all roughness components detectable in a 3 $\mu m \times 3$ $\mu m$ region at a spatial frequency of 1 $\mu m^{-1}$ to 10 $\mu m^{-1}$, can be adjusted so as to be within a prescribed range of values.

(Configuration 13)

Configuration 13 of the present invention is the method of manufacturing a reflective mask blank described in Configuration 12, wherein the material of the absorber film is a material that contains nitrogen, and the film thickness of the absorber film is not more than 60 nm.

According to Configuration 13, as a result of the material of the absorber film containing nitrogen and the film thickness of the absorber film being not more than 60 nm, in addition to being able to reduce shadowing effects, the root mean square roughness (Rms) of the surface of the absorber film and the power spectrum density, which is the amplitude intensity of all roughness components detectable in a 3 $\mu m \times 3$ $\mu m$ region at a spatial frequency of 1 $\mu m^{-1}$ to 10 $\mu m^{-1}$, can be further reduced, and a reflective mask blank is obtained, the reflective mask blank being capable of inhibiting the detection of pseudo defects in a defect inspection using a highly sensitive defect inspection apparatus.

(Configuration 14)

Configuration 14 of the present invention is the method of manufacturing a reflective mask blank described in any of Configurations 7 to 13, further comprising forming a protective film arranged in contact with the surface of the multilayer reflective film.

According to Configuration 14, since damage to the surface of the multilayer reflective film can be inhibited when fabricating a transfer mask (EUV mask) as a result of further comprising a step for forming a protective film, reflectance properties with respect to EUV light can be further improved. In addition, in the resulting reflective mask blank, detection of pseudo defects in a defect inspection of the surface of the protective film using a highly sensitive defect inspection apparatus can be inhibited, and critical defects can be made to be more conspicuous.

(Configuration 15)

Configuration 15 of the present invention is the method of manufacturing a reflective mask blank described in Configuration 14, wherein the protective film is formed by ion beam sputtering by irradiating a sputtering target of a protective film material with an ion beam.

According to Configuration 15, since smoothing of the surface of the protective film is obtained by forming the protective film by ion beam sputtering using a sputtering target of a protective film material in the step for forming the absorber film, the absorber film formed on the protective film and the surface of an etching mask formed on the absorber film can be smoothened, thereby making this preferable.

(Configuration 16)

Configuration 16 of the present invention is the method of manufacturing a reflective mask blank described in any of Configurations 7 to 15, further comprising forming an etching mask film arranged in contact with the surface of the absorber film.

According to Configuration 16, as a result of forming an etching mask film having different dry etching properties from those of the absorber film, a highly precise transfer pattern can be formed when forming a transfer pattern on the absorber film.

(Configuration 17)

Configuration 17 of the present invention is a reflective mask having an absorber pattern, obtained by patterning the absorber film of the reflective mask blank described in any of Configurations 1 to 6 or a reflective mask blank obtained according to the method of manufacturing a reflective mask blank described in any of Configurations 7 to 16, on the multilayer reflective film.

According to the reflective mask of Configuration 17, detection of pseudo defects in a defect inspection using a highly sensitive defect inspection apparatus can be inhibited, and critical defects can be made to be more conspicuous.

(Configuration 18)

Configuration 18 of the present invention is a method of manufacturing a semiconductor device, comprising: a step for forming a transfer pattern on a transferred substrate by carrying out a lithography process with an exposure apparatus using the reflective mask described in Configuration 17.

According to the method of manufacturing a semiconductor device of Configuration 18, since a reflective mask from which contaminants, scratches and other critical defects have been removed can be used in a defect inspection using a highly sensitive defect inspection apparatus, a circuit pattern or other transfer pattern transferred to a resist film formed on a transferred substrate such as a semiconductor substrate is free of defects, and a semiconductor device that has a fine and highly precise transfer pattern can be fabricated.

Effects of the Invention

According to the reflective mask blank and reflective mask of the present invention as previously described, the discovery of contaminants, scratches or other critical defects can be facilitated by inhibiting detection of pseudo defects attributable to surface roughness of a substrate or film in a defect inspection using a highly sensitive defect inspection apparatus. In a reflective mask blank and reflective mask used in EUV lithography in particular, a multilayer reflective film formed on a main surface of a substrate, which exhibits high reflectance, is obtained while inhibiting pseudo defects. In addition, the aforementioned reflective mask blank can be reliably fabricated according to the method of manufacturing a reflective mask blank of the present invention as previously described.

In addition, according to the method of manufacturing a semiconductor device as previously described, since a reflective mask from which contaminants, scratches and other critical defects have been removed can be used in a defect inspection using a highly sensitive defect inspection apparatus, a circuit pattern or other transfer pattern formed on a transferred substrate such as a semiconductor substrate is free of defects, and a semiconductor device can be fabricated that has a fine and highly precise transfer pattern.

EMBODIMENTS FOR CARRYING OUT THE INVENTION

The present invention is a reflective mask blank having a mask blank multilayer film comprising a multilayer reflective film, obtained by alternately laminating a high refractive index layer and a low refractive index layer, and an absorber film on a main surface of a mask blank substrate.

Figure 5:
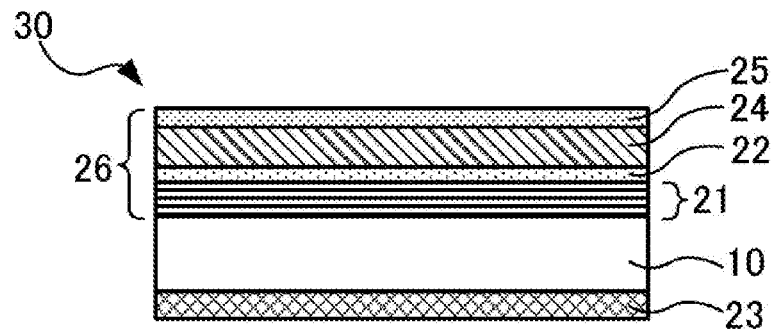
FIG. 5 is a cross-sectional schematic diagram showing another example of the configuration of a reflective mask blank according to one embodiment of the present invention.

FIG. 5 is a schematic diagram showing one example of a reflective mask blank 30 of the present invention. The reflective mask blank 30 of the present invention has a mask blank multilayer film 26 on a main surface of a mask blank substrate 10. In the present description, the mask blank multilayer film 26 refers to a plurality of films, comprising a multilayer reflective film 21 and an absorber film 24, formed by laminating on a main surface of the mask blank substrate 10. The mask blank multilayer film 26 can further comprise a protective film 22 formed between the multilayer reflective film 21 and the absorber film 24, and/or an etching mask film 25 formed on the surface of the absorber film 24. In the case of the reflective mask blank 30 shown in FIG. 5, the mask blank multilayer film 26 on a main surface of the mask blank substrate 10 has the multilayer reflective film 21, the protective film 22, the absorber film 24 and the etching mask film 25. Furthermore, in subsequent explanations, with respect to the etching mask film 25, the etching mask film 25 is assumed to be stripped after having formed a transfer pattern on the absorber film 24. However, in the reflective mask blank 30 in which the etching mask film 25 is not formed, a laminated structure having a plurality of layers is employed for the absorber film 24, and the reflective mask blank 30 may be that in which the absorber film 24 has been given the function of an etching mask by using materials having mutually different etching properties for the materials composing the plurality of layers.

In the present description, "having a mask blank multilayer film 26 on a main surface of the mask blank substrate 10" refers to the case in which the mask blank multilayer film 26 is arranged in contact with the surface of the mask blank substrate 10, as well as the case in which another film is present between the mask blank substrate 10 and the mask blank multilayer film 26. In addition, "a film A arranged in contact with the surface of a film B" refers to film A and film B being arranged so as to make direct contact without having another film interposed between film A and film B.

Figure 3:
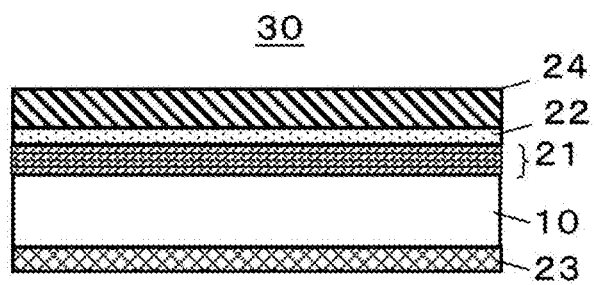
FIG. 3 is a cross-sectional schematic diagram showing one example of the configuration of a reflective mask blank according to one embodiment of the present invention.

FIG. 3 is a schematic diagram showing another example of the reflective mask blank 30 of the present invention. In the case of the reflective mask blank 30 of FIG. 3, although the mask blank multilayer film 26 has the multilayer reflective film 21, the protective film 22 and the absorber film 24, it does not have the etching mask film 25.

The reflective mask blank 30 of the present invention has a root mean square roughness (Rms), obtained by measuring a 3 μm×3 μm region on the surface of the reflective mask blank 30 where the mask blank multilayer film 26 is formed with an atomic force microscope, of not more than 0.5 nm and a power spectrum density at a spatial frequency of 1 μm$^{-1}$ to 10 μm$^{-1}$ of not more than 50 nm$^4$.

According to the reflective mask blank 30 of the present invention, the discovery of contaminants, scratches or other critical defects can be facilitated by inhibiting the detection of pseudo defects attributable to surface roughness of a substrate or film in a defect inspection using a highly sensitive defective inspection apparatus.

Next, the following provides an explanation of the parameters of surface roughness (Rmax, Rms) and power spectrum density (PSD), which indicate the surface morphology of a main surface of the reflective mask blank 30 on which the mask blank multilayer film 26 is formed.

First, Rms (root mean square), which is a typical indicator of surface roughness, refers to root mean square roughness and is the square root of the value obtained by averaging the squares of the deviation from an average line to a measurement curve. Rms is represented by the following formula (1):

[Equation 1]

$$Rms = \sqrt{\frac{1}{l}\int_0^l Z^2(x)dx} \quad (1)$$

wherein, l represents a reference length and Z represents the height from the average line to the measurement curve.

Similarly, Rmax, which is also a typical indicator of surface roughness, is the maximum height of surface roughness, and is the difference between the absolute values of maximum peak height and maximum trough depth on a roughness curve (difference between the highest peak and the deepest trough).

Rms and Rmax have conventionally been used to manage the surface roughness of the mask blank substrate 10, and are superior with respect to enabling surface roughness to be ascertained in terms of numerical values. However, since Rms and Rmax both only consist of information relating to height, they do not contain information relating to subtle changes in surface morphology.

In contrast, power spectrum analysis, which represents surface roughness using amplitude intensity at a spatial frequency by converting surface irregularities of the resulting surface to spatial frequency regions, enables quantification of subtle changes in surface morphology. When Z(x,y) is taken to represent height data at an x coordinate and y coordinate, then the Fourier transformation thereof is given by the following equation (2).

[Equation 2]

$$F(u, v) = \frac{1}{N_x N_y} \sum_{u=0}^{N_x-1} \sum_{v=0}^{N_y-1} Z(x, y) \exp\left[-i2\pi\left(\frac{ux}{N_x} + \frac{vy}{N_y}\right)\right] \quad (2)$$

Here, $N_x$ and $N_y$ represent the number of data sets in the x direction and y direction, u represents 0, 1, 2, . . . Nx−1, v represents 0, 1, 2 . . . Ny−1, and spatial frequency f at this time is given by the following equation (3).

[Equation 3]

$$f = \left\{ \left[\frac{u}{(N_x-1)d_x}\right]^2 + \left[\frac{v}{(N_y-1)d_y}\right]^2 \right\}^{1/2} \quad (3)$$

Here, in equation (3), $d_x$ represents the minimum resolution in the x direction while $d_y$ represents the minimum resolution in the y direction.

Power spectrum density PSD at this time is given by the following equation (4).

[Equation 4]

$$P(u,v) = |F(u,v)|^2 \quad (4)$$

This power spectrum analysis is superior in that it not only makes it possible to ascertain changes in the surface morphology of the mask blank multilayer film 26 of the reflective mask blank 30 as simple changes in height, but also as changes at that spatial frequency, and enables analysis of the effects of microscopic reactions at the atomic level on the surface.

In the reflective mask blank 30 of the present invention, in order to obtain the aforementioned object, the root mean square roughness (Rms) of the surface of the mask blank multilayer film 26, obtained by measuring a 3 μm×3 μm region with an atomic force microscope, is not more than 0.5 nm, and power spectrum density at a spatial frequency of 1 μm$^{-1}$ to 10 μm$^{-1}$ is not more than 50 nm$^4$, using the surface roughness (Rms) and power spectrum density described above.

In the present invention, the aforementioned 3 μm×3 μm region may be any arbitrary location of a region where a transfer pattern is formed. In the case the mask blank substrate 10 is a 6025 size (152 mm×152 mm×6.35 mm), then the transfer pattern formation region can be, for example, a 142 mm×142 mm region, obtained by excluding the peripheral region of the surface of the reflective mask blank substrate 30, a 132 mm×132 mm region or a 132 mm×104 mm region. In addition, the aforementioned arbitrary location can be a region located in the center of the surface of the reflective mask blank 30, for example.

In addition, in the present invention, the aforementioned 3 μm×3 μm region can be a region located in the center of the film surface of the mask blank laminated film 26. For example, in the case the film surface of the mask blank laminated film 26 of the reflective mask blank 30 has a rectangular shape, the aforementioned center is located at the intersection of the diagonal lines of the aforementioned rectangle. Namely, the aforementioned intersection and the center of the aforementioned region (and the center of the region is the same as the center of the film surface) coincide.

In addition, the previously explained 3 μm×3 μm region, the transfer pattern formation region and the arbitrary location can also be applied to the mask blank substrate 10 and a substrate with a multilayer reflective film 20 depending on the case.

In addition, in the case of carrying out a defect inspection on the surface of the reflective mask blank 30 using a highly sensitive defect inspection apparatus using inspection light in a wavelength region of 150 nm to 365 nm, such as a highly sensitive defect inspection apparatus using a UV laser having an inspection light source frequency of 266 nm or an ArF excimer laser having an inspection light source frequency of 193 nm, the power spectrum density at a spatial frequency of 1 μm$^{-1}$ to 10 μm$^{-1}$ obtained by measuring a 3 μm×3 μm region of the aforementioned surface with an atomic force microscope can be made to be not more than 50 nm$^4$, the power spectrum density at a spatial frequency of 1 μm$^{-1}$ to 10 μm$^{-1}$ is preferably not more than 45 nm$^4$, the power spectrum density at a spatial frequency of 1 μm$^{-1}$ to 10 μm$^{-1}$ is more preferably not more than 40 nm$^4$, the power spectrum density at a spatial frequency of 1 μm$^{-1}$ to 10 μm$^{-1}$ is even more preferably not more than 35 nm$^4$, and the power spectrum density at a spatial frequency of 1 μm$^{-1}$ to 10 μm$^{-1}$ is still more preferably not more than 30 nm$^4$.

In addition, the aforementioned root mean square roughness (Rms) is preferably not more than 0.5 nm, more preferably not more than 0.45 nm, even more preferably not more than 0.40 nm, even more preferably not more than 0.35 nm, even more preferably not more than 0.30 nm, and still more preferably not more than 0.25 nm. In addition, maximum height (Rmax) is preferably not more than 5 nm, more preferably not more than 4.5 nm, even more preferably not more than 4 nm, even more preferably not more than 3.5 nm, even more preferably not more than 3 nm, and still more preferably not more than 2.5 nm.

In addition, in the reflective mask blank 30 of the present invention, in order to achieve the aforementioned object, an integrated value I of the power spectrum density at a spatial frequency of 1 μm$^{-1}$ to 10 μm$^{-1}$ obtained by measuring a 3 μm×3 μm region of the surface of the mask blank multilayer film 26 with an atomic force microscope is preferably not more than 800×10$^{-3}$ nm$^3$. The aforementioned integrated value I is more preferably not more than 650×10$^{-3}$ nm$^3$. The aforementioned integrated value I is even more preferably not less than 500×10⁻³ nm³. The aforementioned integrated value I is particularly preferably not more than 450×10⁻³ nm³.

According to the reflective mask blank 30 of the present invention, the discovery of contaminants, scratches or other critical defects can be facilitated by inhibiting detection of pseudo defects attributable to surface roughness of a substrate or film in a defect inspection using a highly sensitive defect inspection apparatus.

Next, a detailed explanation is provided of the reflective mask blank 30 of the present invention.

[Mask Blank Substrate 10]

First, an explanation is provided of the mask blank substrate 10 that can be used to fabricate the reflective mask blank 30 of the present invention.

Figure 1:
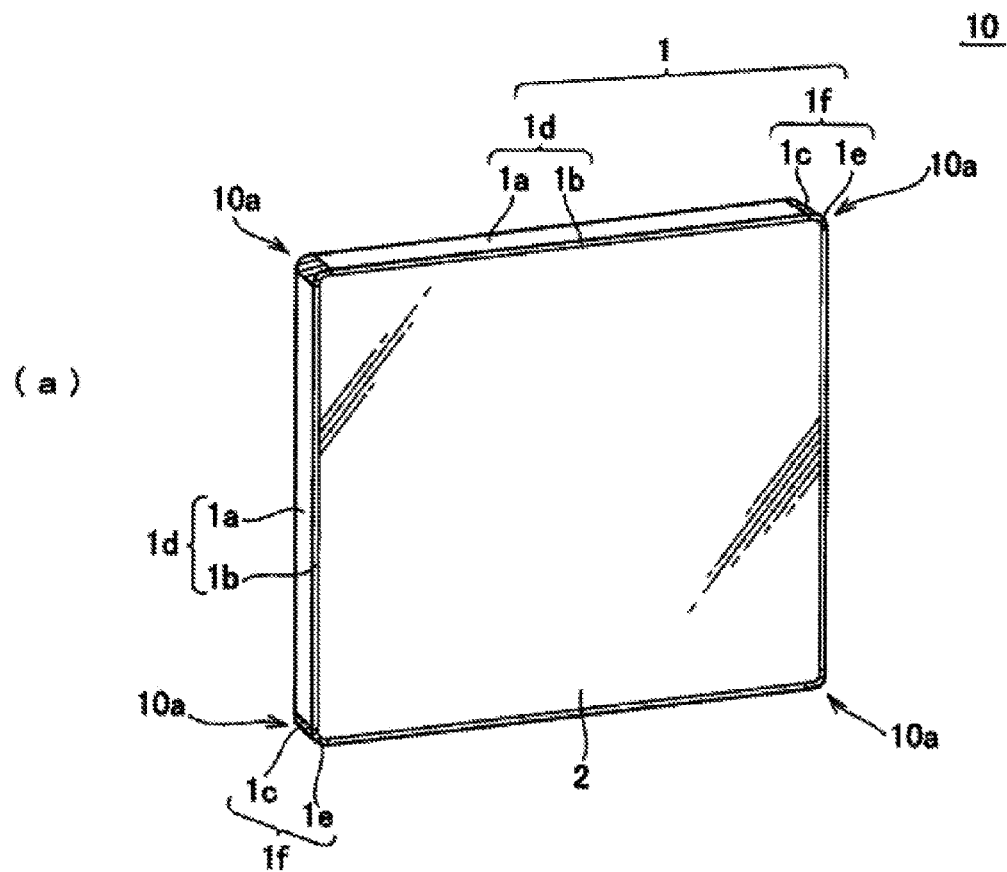
FIG. 1(a) is a perspective view showing a mask blank substrate according to one embodiment of the present invention.
FIG. 1(b) is a cross-sectional schematic diagram showing a mask blank substrate of the present embodiment.
Figure 1:
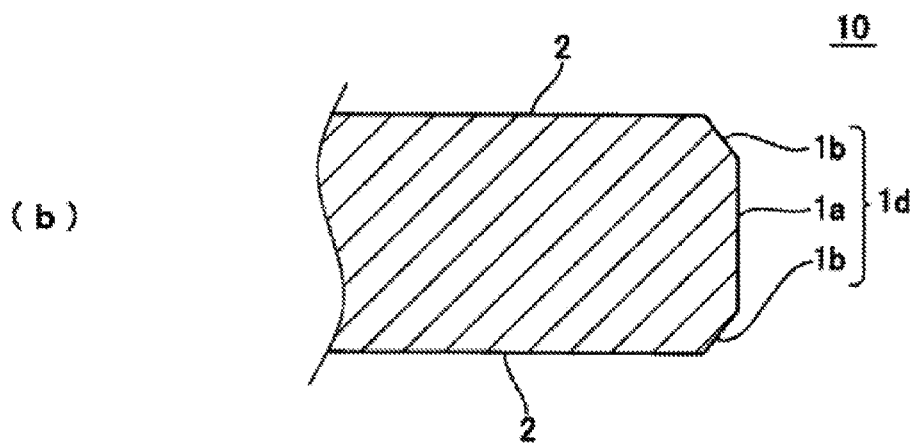

FIG. 1(*a*) is a perspective view showing one example of the mask blank substrate 10 that can be used to fabricate the reflective mask blank 30 of the present invention. FIG. 1(*b*) is a cross-sectional schematic diagram of the mask blank substrate 10 shown in FIG. 1(*a*).

The mask blank substrate 10 (which may be simply referred to as the substrate 10) is a rectangular plate-like body, and has two opposing main surfaces 2 and an edge face 1. The two opposing main surfaces 2 constitute an upper surface and a lower surface of this plate-like body, and are formed so as to be mutually opposing. In addition, at least one of the two opposing main surfaces 2 is a main surface on which a transfer pattern is to be formed.

The edge face 1 constitutes the lateral surface of this plate-like body, and is adjacent to the outer edges of the opposing main surfaces 2. The edge face 1 has a flat edge face portion 1*d* and a curved edge face portion 1*f*. The flat edge face portion 1*d* is a surface that connects a side of one of the opposing main surfaces 2 and a side of the other opposing main surface 2, and comprises a lateral surface portion 1*a* and a chamfered surface portion 1*b*. The lateral surface portion 1*a* is a portion (T surface) that is nearly perpendicular to the opposing main surfaces 2 in the flat edge face portion 1*d*. The chamfered surface portion 1*b* is a portion (C surface) that is chamfered between the lateral surface portion 1*a* and the opposing main surfaces 2, and is formed between the lateral surface portion 1*a* and the opposing main surfaces 2

The curved edge face portion 1*f* is a portion (R portion) that is adjacent to the vicinity of a corner portion 10*a* of the substrate 10 when the substrate 10 is viewed from overhead, and comprises a lateral surface portion 1*c* and a chamfered surface portion 1*e*. Here, when the substrate 10 is viewed from overhead, the substrate 10 appears in, for example, a direction perpendicular to the opposing main surfaces 2. In addition, the corner portion 10*a* of the substrate 10 refers to, for example, the vicinity of the intersection of two sides along the outer edge of the opposing main surfaces 2. An intersection of two sides is the intersection of lines respectively extending from two sides. In the present example, the curved end face portion if is formed into a curved shape by rounding the corner portion 10*a* of the substrate 10.

In order to more reliably achieve the object of the present invention, the main surfaces of the mask blank substrate 10 used in the reflective mask blank 30 of the present invention and the surface of the multilayer reflective film 21 of the substrate with a multilayer reflective film 20 preferably have a prescribed surface roughness and a prescribed power spectrum density (PSD) in the same manner as the surface of the reflective mask blank 30 of the present invention.

In addition, the surface of the mask blank substrate 10 is preferably processed by catalyst referred etching (CARE).

CARE refers to a surface processing method involving arranging a processing target (mask blank substrate) and catalyst in a treatment liquid or supplying a treatment liquid between the processing target and the catalyst, allowing the processing target and catalyst to make contact, and processing the processing target with an active species generated from molecules in the treatment liquid that have been adsorbed on the catalyst at that time. Furthermore, in the case the processing target is composed of a solid oxide such as glass, water is used for the treatment liquid, the processing target and the catalyst are allowed to make contact in the presence of the water, and the catalyst and surface of the processing target are allowed to undergo relative motion and the like to remove decomposition products of hydrolysis from the surface of the processing target.

Main surfaces of the mask blank substrate 10 are selectively processed by catalyst referred etching starting from protrusions that contact a reference surface in the form of a catalyst surface. Consequently, surface irregularities (surface roughness) that compose the main surfaces retain an extremely high level of smoothness resulting in an extremely uniform surface morphology, while also resulting in a surface morphology in which the proportion of concave portions that compose the reference surface is greater than the proportion of convex portions. Thus, in the case of laminating a plurality of thin films on the aforementioned main surfaces, since the size of defects on the main surfaces tends to become small, surface processing by catalyst referred etching is preferable in terms of defect quality. This effect is especially demonstrated in the case of forming the multilayer reflective film 21 to be subsequently described on the aforementioned main surfaces in particular. In addition, as a result of processing the main surfaces by catalyst referred etching as previously described, a surface having a prescribed range of surface roughness and a prescribed power spectrum density as previously described can be formed comparatively easily.

Furthermore, in the case the material of the substrate 10 is a glass material, at least one type of material selected from the group consisting of platinum, gold, transition metals and alloys comprising at least one of these materials can be used for the catalyst. In addition, at least one type of liquid selected from the group consisting of pure water, functional water such as ozonated water or hydrogen water, low-concentration aqueous alkaline solutions and low-concentration aqueous acidic solutions can be used for the treatment liquid.

As a result of making the surface roughness and power spectrum density of a main surface to be within the aforementioned ranges as previously described, detection of pseudo defects can be significantly inhibited in a defect inspection by, for example, the "MAGICS M7360" Mask/Substrate/Blank Defect Inspection Apparatus for EUV Exposure manufactured by Lasertec Corp. (inspection light source wavelength: 266 nm) or the "Teron 610" Reticle, Optical Mask/Blank and UV Mask/Blank Defect Inspection Apparatuses manufactured by KLA-Tencor Corp. (inspection light source wavelength: 193 nm).

Furthermore, the aforementioned inspection light source wavelength is not limited to 266 nm and 193 nm. A wavelength of 532 nm, 488 nm, 364 nm or 257 nm may also be used for the inspection light source wavelength.

A main surface on the side, on which a transfer pattern of the mask blank substrate 10 used in the reflective mask blank 30 of the present invention is formed, is preferably processed so as to have high flatness at least from the viewpoints of obtaining pattern transfer accuracy and positional accuracy. In the case of an EUV reflective mask blank substrate, flatness in a 132 mm×132 mm region or a 142 mm×142 mm region on a main surface of the substrate 10 on the side on which a transfer pattern is formed is preferably not more than 0.1 μm and particularly preferably not more than 0.05 μm. In addition, flatness in a 132 mm×132 mm region on a main surface of the substrate 10 on which a transfer pattern is formed is more preferably not more than 0.03 μm. In addition, the main surface on the opposite side from the side on which a transfer pattern is formed is the side that is clamped with an electrostatic chuck when the substrate is placed in an exposure apparatus, and flatness in a 142 mm×142 mm region is preferably not more than 1 μm and particularly preferably not more than 0.5 μm.

Any material may be used for the material of the reflective mask blank substrate 10 for EUV exposure provided it has low thermal expansion properties. For example, an $SiO_2$—$TiO_2$-based glass having low thermal expansion properties (such as a two-element system ($SiO_2$—$TiO_2$) or three-element system (such as $SiO_2$—$TiO_2$—$SnO_2$)), or a so-called multicomponent glass such as $SiO_2$—$Al_2O_3$—$Li_2O$-based crystallized glass, can be used. In addition, a substrate other than the aforementioned glass made of silicon or metal and the like can also be used. An example of the aforementioned metal substrate is an invar alloy (Fe—Ni-based alloy).

As was previously described, in the case of the mask blank substrate 10 for EUV exposure, a multicomponent glass material is used since the substrate is required to have low thermal expansion properties. However, there is the problem of it being difficult to obtain high smoothness with a multicomponent glass material in comparison with synthetic quartz glass. In order to solve this problem, a thin film composed of a metal or an alloy, or a thin film composed of a material containing at least one of oxygen, nitrogen and carbon in a metal or alloy, is formed on a substrate composed of a multicomponent glass material. A surface having a surface roughness and a power spectrum density within the aforementioned ranges can then be formed comparatively easily by subjecting the surface of the thin film to mirror polishing and surface treatment.

Preferable examples of the material of the aforementioned thin film include Ta (tantalum), alloys containing Ta and Ta compounds containing at least one of oxygen, nitrogen and carbon in Ta or an alloy containing Ta. Examples of Ta compounds that can be used include those selected from TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON. Among these Ta compounds, TaN, TaON, TaCON, TaBN, TaBON, TaBCON, TaHfN, TaHfON, TaHfCON, TaSiN, TaSiON and TaSiCON that contain nitrogen (N) are used more preferably. Furthermore, from the viewpoint of high smoothness of the thin film surface, the aforementioned thin film preferably has an amorphous structure. The crystal structure of the thin film can be measured with an X-ray diffraction (XRD) analyzer.

Furthermore, in the present invention, there are no particular limitations on the processing method used to obtain surface roughness and power spectrum density within the aforementioned defined ranges. The present invention is characterized in the managing of the surface roughness and power spectrum density of the reflective mask blank 30, and can be realized by, for example, processing methods like those exemplified in the examples to be subsequently described.

[Substrate with Multilayer Reflective Film 20]

The following provides an explanation of the substrate with a multilayer reflective film 20 that can be used in the reflective mask blank 30 of the present invention.

Figure 2:
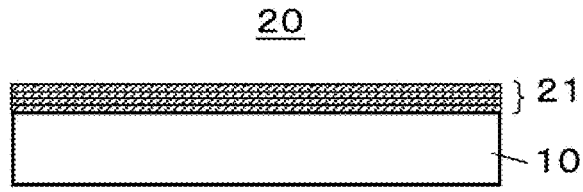
FIG. 2 is a cross-sectional schematic diagram showing one example of the configuration of a substrate with a multilayer reflective film according to one embodiment of the present invention.

FIG. 2 is a schematic diagram of one example of the substrate with a multilayer reflective film 20 able to be used in the reflective mask blank 30.

The substrate with a multilayer reflective film 20 of the present embodiment has a structure having the multilayer reflective film 21 on a main surface of the previously explained mask blank substrate 10 on the side on which a transfer pattern is formed. This multilayer reflective film 21 imparts a function of reflecting EUV light in a reflective mask 40 for EUV lithography, and adopts a configuration in which elements having different refractive indices are cyclically laminated.

There are no particular limitations on the material of the multilayer reflective film 21 provided it reflects EUV light. The reflectance of the multilayer reflective film 21 alone is normally not less than 65% and the upper limit thereof is normally 73%. This type of multilayer reflective film 21 can be that of a multilayer reflective film 21 in which a thin film composed of a high refractive index material (high refractive index layer) and a thin film composed of a low refractive index material (low refractive index layer) are alternately laminated for about 40 to 60 cycles.

For example, the multilayer reflective film 21 for EUV light of a wavelength of 13 nm to 14 nm preferably consists of an Mo/Si cyclically laminated film obtained by alternately laminating about 40 cycles of an Mo film and Si film. In addition, a multilayer reflective film used in the region of EUV light can consist of, for example, an Ru/Si cyclically laminated film, Mo/Be cyclically laminated film, Mo compound/Si compound cyclically laminated film, Si/Nb cyclically laminated film, Si/Mo/Ru cyclically laminated film, Si/Mo/Ru/Mo cyclically laminated film or Si/Ru/Mo/Ru cyclically laminated film.

The method used to form the multilayer reflective film 21 is known in the art. The multilayer reflective film 21 can be formed by depositing each layer by, for example, magnetron sputtering or ion beam sputtering. In the case of the aforementioned Mo/Si cyclically laminated film, an Si film having a thickness of about several nm is first deposited on the substrate 10 using an Si target by, for example, ion beam sputtering, followed by depositing an Mo film having a thickness of about several nm using an Mo target and, with this deposition comprising one cycle, laminating for 40 to 60 cycles, to form the multilayer reflective film 21.

When fabricating the reflective mask blank 30 of the present invention, the multilayer reflective film 21 is preferably formed by ion beam sputtering by alternately irradiating a sputtering target of a high refractive index material and a sputtering target of a low refractive index material. As a result of forming the multilayer reflective film by a prescribed ion beam sputtering method, the multilayer reflective film 21 having favorable reflectance properties with respect to EUV light can be reliably obtained.

In the reflective mask blank 30 of the present invention, the mask blank multilayer film 26 preferably further comprises the protective film 22 arranged in contact with the surface of the multilayer reflective film 21 on the opposite side from the mask blank substrate 10.

The protective film 22 (see FIG. 3) can be formed to protect the multilayer reflective film 21 from dry etching or wet cleaning in the manufacturing process of the reflective mask 40 for EUV lithography. In this manner, an aspect having the multilayer reflective film 21 and the protective film 22 on the mask blank substrate 10 can also constitute the substrate with a multilayer reflective film 20 in the present invention.

Furthermore, materials selected from, for example, Ru, Ru—(Nb, Zr, Y, B, Ti, La, Mo), Si—(Ru, Rh, Cr, B), Si, Zr, Nb, La and B can be used for the material of the aforementioned protective film 22. Among these materials, reflectance properties of the multilayer reflective film 21 can be made more favorable if a material comprising ruthenium (Ru) is applied. More specifically, the material of the protective film 22 is preferably Ru or Ru—(Nb, Zr, Y, B, Ti, La, Mo). This type of protective film 22 is particularly effective in the case of patterning the absorber film 24 using a Ta-based material for the absorber film and dry etching using a Cl-based gas.

Furthermore, in the aforementioned substrate with a multilayer reflective film 20, the surface of the multilayer reflective film 21 or the protective film 22 is such that the power spectrum density at a spatial frequency of 1 $\mu m^{-1}$ to 10 $\mu m^{-1}$, obtained by measuring a 0.3 mm×0.3 mm region thereof with an atomic force microscope, is not more than 25 $nm^4$, preferably not more than 22.5 $nm^4$ and even more preferably not more than 20 $nm^4$. As a result of configuring in this manner, in the case of carrying out a defect inspection on the substrate with a multilayer reflective film 20 with a highly sensitive defect inspection apparatus that uses inspection light in the wavelength region of 150 nm to 365 nm, such as the previously mentioned highly sensitive inspection apparatus using a UV laser having an inspection light source wavelength of 266 nm or ArF excimer laser having an inspection light source wavelength of 193 nm, detection of pseudo defects can be inhibited significantly while also enabling critical defects to be made more conspicuous.

Moreover, in addition to the effect of enabling the detection of pseudo defects to be inhibited significantly in a defect inspection using a highly sensitive defect inspection apparatus as previously described, in order to improve reflection properties required for use as the substrate with a multilayer reflective film 20, the root mean square roughness (Rms) of the aforementioned substrate with a multilayer reflective film 20 on the surface of the multilayer reflective film 21 or the protective film 22 obtained by measuring a 3 µm×3 µm region with an atomic force microscope is not more than 0.25 nm, preferably not more than 0.20 nm and more preferably not more than 0.15 nm.

In order to maintain the surface morphology of the aforementioned substrate 10 within the aforementioned ranges and allow the surface of the multilayer reflective film 21 or the protective film 22 to have a power spectrum density within the aforementioned ranges, the multilayer reflective film 21 is obtained by depositing by sputtering so that a high refractive index layer and a low refractive index layer accumulate on an angle to the normal of a main surface of the substrate 10. More specifically, the incident angle of sputtered particles for depositing a low refractive index layer consisting of Mo and the like and the incident angle of sputtered particles for depositing a high refractive index layer consisting of Si and the like are greater than 0 degrees to not more than 45 degrees, more preferably greater than 0 degrees to not more than 40 degrees, and even more preferably greater than 0 degrees to not more than 30 degrees. Moreover, the protective film 22 formed on the multilayer reflective film 21 is also preferably formed by ion beam sputtering in continuation therefrom so that the protective film 22 accumulates on an angle to the normal of a main surface of the substrate 10.

In addition, in the substrate with a multilayer reflective film 20, a back side electrically conductive film 23 (see FIG. 3) for the purpose of electrostatic clamping can also be formed on the surface of the mask blank substrate 10 on the opposite side from the surface contacting the multilayer reflective film 21 of the substrate 10. In this manner, an aspect having the multilayer reflective film 21 and the protective film 22 on the side of the mask blank substrate 10 on which a transfer pattern is formed, and having the back side electrically conductive film 23 on the surface on the opposite side from the surface contacting the multilayer reflective film 21, also constitutes the substrate with a multilayer reflective film 20 in the present invention. Furthermore, the electrical property (sheet resistance) required by the back side electrically conductive film 23 is normally not more than 100 Ω/square. The method used to form the back side electrically conductive film 23 is a known method, and it can be formed, for example, using a metal or alloy target of Cr or Ta and the like by magnetron sputtering or ion beam sputtering.

In addition, the substrate with a multilayer reflective film 20 of the present embodiment may also have a base layer formed between the mask blank substrate 10 and the multilayer reflective film 21. The base layer can be formed for the purpose of improving smoothness of a main surface of the substrate 10, reducing defects, demonstrating the effect of enhancing reflectance of the multilayer reflective film 21, and compensating for stress in the multilayer reflective film 21.

[Reflective Mask Blank 30]

The following provides an explanation of the reflective mask blank 30 of the present invention.

FIG. 3 is a schematic diagram showing one example of the reflective mask blank 30 of the present invention.

The reflective mask blank 30 of the present invention employs a configuration in which an absorber film 24 serving as a transfer pattern is formed on the protective film 22 of the substrate with a multilayer reflective film 20 that is previously explained.

The aforementioned absorber film 24 is only required to be that which has a function that absorbs exposure light in the form of EUV light, and has a desired difference in reflectance between light reflected by the aforementioned multilayer reflective film 21 and the protective film 22 and light reflected by an absorber pattern 27.

For example, reflectance with respect to EUV light of the absorber film 24 is set to between 0.1% and 40%. Moreover, in addition to the aforementioned difference in reflectance, the absorber film 24 may also have a desired phase difference between light reflected by the aforementioned multilayer reflective film 21 or the protective film 22, and light reflected by the absorber pattern 27. Furthermore, in the case of having such a phase difference between reflected light, the absorber film 24 in the reflective mask blank 30 may be referred to as a phase shift film. In the case of improving the contrast of reflected light of a reflective mask obtained by providing the aforementioned desired phase difference between reflected light, the phase difference is preferably set to within the range of 80 degrees±10 degrees, the reflectance of the absorber film 24 in terms of absolute reflectance is preferably set to 1.5% to 30%, and the reflectance of the absorber film 24 with respect to the surface of the multilayer reflective film 21 and/or the protective film 22 is preferably set to 2% to 40%.

The aforementioned absorber film 24 may be a single layer or a multilayered structure. In the case of a multilayered structure, the laminated films may be of the same material or different materials. The laminated film can be that in which the materials and composition change incrementally and/or continuously in the direction of film thickness.

There are no particular limitations on the material of the aforementioned absorber film 24. For example, a material having the function of absorbing EUV light that is composed of Ta (tantalum) alone or a material having Ta as the main component thereof is used preferably. A material having Ta as the main component thereof is normally a Ta alloy. The crystalline state of this absorber film 24 is such that it preferably has an amorphous or microcrystalline structure from the viewpoints of smoothness and flatness. Examples of materials that can be used for the material having Ta as the main component thereof include materials selected from materials containing Ta and B, materials containing Ta and N, materials containing Ta and B and further containing at least O or N, materials containing Ta and Si, materials containing Ta, Si and N, materials containing Ta and Ge, and materials containing Ta, Ge and N. In addition, an amorphous structure is easily obtained by adding, for example, B, Si or Ge and the like to Ta, thereby making it possible to improve smoothness. Moreover, if N and/or O are added to Ta, resistance to oxidation improves, thereby making it possible to improve stability over time. In order to maintain the surface morphology of the substrate 10 and the substrate with a multilayer reflective film 20 within the aforementioned ranges and allow the surface of the absorber film 24 to have a power spectrum density within the aforementioned ranges, a microcrystalline structure or amorphous structure is preferably employed for the absorber film 24. Crystal structure can be confirmed with an X-ray diffraction (XRD) instrument.

More specifically, examples of materials containing tantalum that form the absorber film 24 include tantalum metal and materials that contain tantalum and one or more elements selected from nitrogen, oxygen, boron and carbon, but do not substantially contain hydrogen. Examples thereof include Ta, TaN, TaON, TaBN, TaBON, TaCN, TaCON, TaBCN and TaBOCN. The aforementioned materials may also contain metals other than tantalum within a range that allows the effects of the present invention to be obtained. When the material, containing tantalum that forms the absorber film 24, contains boron, it facilitates to control the absorber film 24 so as to adopt an amorphous (non-crystalline) structure.

The absorber film 24 of the mask blank is preferably formed with a material containing tantalum and nitrogen. The nitrogen content in the absorber film 24 is preferably not more than 50 at %, more preferably not more than 30 at %, even more preferably not more than 25 at % and still more preferably not more than 20 at %. The nitrogen content in the absorber film 24 is preferably not less than 5 at %.

In the reflective mask blank 30 of the present invention, the absorber film 24 preferably contains tantalum and nitrogen and the nitrogen content is 10 at % to 50 at %, more preferably 15 at % to 50 at %, and even more preferably 30 at % to 50 at %. As a result of the absorber film 24 containing tantalum and nitrogen and the nitrogen content being 10 at % to 50 at %, the root mean square roughness (Rms) and the power spectrum density, which is the amplitude intensity of all roughness components detectable in a 3 μm×3 μm region at a spatial frequency of 1 μm$^{-1}$ to 10 μm$^{-1}$, on the surface of the absorber film 24 can be made to be within the prescribed ranges of values, and since enlargement of crystal grains that compose the absorber film can be inhibited, pattern edge roughness when patterning the absorber film can be reduced.

In the reflective mask blank 30 of the present invention, the film thickness of the absorber film 24 is set to the film thickness required for the absorber film 24 to have a desired difference in reflectance between light reflected by the multilayer reflective film 21 and the protective film 22 and light reflected by the absorber pattern 27. The film thickness of the absorber film 24 is preferably not more than 60 nm in order to reduce shadowing effects. As a result of making the film thickness of the absorber film 24 to be 60 nm, the root mean square roughness (Rms) and the power spectrum density, which is the amplitude intensity of all roughness components detectable in a 3 μm×3 μm region at a spatial frequency of 1 μm$^{-1}$ to 10 μm$^{-1}$, of the surface of the absorber film 24 can be further reduced, thereby making it possible to inhibit the detection of pseudo defects in a defect inspection using a highly sensitive defect inspection apparatus.

In addition, in the reflective mask blank 30 of the present invention, the aforementioned absorber film 24 can be given a phase shift function having a desired phase shift difference between light reflected by the aforementioned multilayer reflective film 21 and the protective film 22 and light reflected by the absorber pattern 27. In that case, a reflective mask blank that serves as the master of a reflective mask having improved transfer resolution by EUV light, is obtained. In addition, since the film thickness of the absorber required to demonstrate a phase shift effect needed to demonstrate desired transfer resolution can be reduced in comparison with that in the prior art, a reflective mask blank is obtained in which shadowing effects are reduced.

There are no particular limitations on the material of the absorber film 24 having a phase shift function. For example, Ta alone or a material having Ta as the main component thereof can be used as previously described, or another material may be used. Examples of materials other than Ta include Ti, Cr, Nb, Mo, Ru, Rh and W. In addition, an alloy containing two or more elements among Ta, Ti, Cr, Nb, Mo, Ru, Rh and W can be used for the material, and a multilayer film can be used consisting of layers having these elements as materials thereof. In addition, one or more elements selected from nitrogen, oxygen and carbon may also be contained in these materials. Among these, by employing a material containing nitrogen, the root mean square roughness (Rms) and the power spectrum density, which is the amplitude intensity of all roughness components detectable in a 3 μm×3 μm region at a spatial frequency of 1 μm$^{-1}$ to 10 μm$^{-1}$, of the surface of the absorber film can be reduced, and a reflective mask blank that is able to inhibit the detection of pseudo defects in a defect inspection using a highly sensitive defect inspection apparatus can be obtained, thereby making this preferable. Furthermore, in the case of using the absorber film 24 in the form of a laminated film, the laminated film may be a laminated film consisting of layers of the same material or a laminated film consisting of layers of different materials. In the case of using a laminated film consisting of layers of different materials for the absorber film 24, the materials that compose this plurality of layers may be materials having mutually different etching properties to obtain an absorber film 24 having an etching mask function.

In the case the uppermost surface of the reflective mask blank 30 of the present invention is the absorber film 24, the root mean square roughness (Rms) and power spectrum density at a spatial frequency of 1 μm$^{-1}$ to 10 μm$^{-1}$ in a 3 μm×3 μm region on the surface of the absorber film 24 are made to be within the prescribed ranges of values. According to the reflective mask blank 30 of the present invention having such a configuration, the detection of pseudo defects attributable to surface roughness of a substrate or film in a defect inspection using a highly sensitive defect inspection apparatus can be inhibited, and the discovery of contaminants or scratches and other critical defects can be facilitated.

Furthermore, the reflective mask blank 30 of the present invention is not limited to the configuration shown in FIG. 3. For example, a resist film serving as a mask for patterning the aforementioned absorber film 24 can also be formed on the absorber film 24, and this reflective mask with a resist film 30 can also constitute the reflective mask blank 30 of the present invention. Furthermore, the resist film formed on the absorber film 24 may be a positive resist or negative resist. In addition, the resist film may also be for electron beam drawing or laser drawing. Moreover, a so-called hard mask (etching mask) film can also be formed between the absorber film 24 and the aforementioned resist film, and this aspect can also constitute the reflective mask blank 30 of the present invention.

In the reflective mask blank 30 of the present invention, the mask blank multilayer film 26 preferably further comprises the etching mask film 25 arranged in contact with the surface of the absorber film 24 on the opposite side form the mask blank substrate 10. In the case of the reflective mask blank 30 shown in FIG. 5, the mask blank multilayer film 26 on a main surface of the mask blank substrate 10 further has the etching mask film 25 in addition to the multilayer reflective film 21, the protective film 22 and the absorber film 24. The reflective mask blank 30 of the present invention may further have a resist film on the uppermost surface of the mask blank multilayer film 26 of the reflective mask blank 30 shown in FIG. 5.

More specifically, in the reflective mask blank 30 of the present invention, in the case the material of the absorber film 24 uses Ta alone or a material having Ta has the main component thereof, a structure is preferably employed in which the etching mask film 25 composed of a material containing chromium is formed on the absorber film 24. As a result of employing the reflective mask blank 30 having such a structure, the reflective mask 40 can be fabricated in which optical properties of the absorber film 24 with pattern are favorable even if the etching mask film 25 is removed by dry etching using a mixed gas of a chlorine-based gas and oxygen gas after forming a transfer pattern on the absorber film 24. In addition, a reflective mask 40 can be fabricated in which line edge roughness of a transfer pattern formed on the absorber film 24 is favorable.

Examples of materials containing chromium that form the etching mask film 25 include materials containing chromium and one or more elements selected from nitrogen, oxygen, carbon and boron. Examples thereof include CrN, CrON, CrCN, CrCON, CrBN, CrBON, CrBCN and CrBOCN. The aforementioned materials may also contain materials other than chromium within a range that allows the effects of the present invention to be obtained. The film thickness of the etching mask film 25 is preferably not less than 3 nm from the viewpoints of functioning as an etching mask with which a transfer pattern is accurately formed on the absorber film 24. In addition, the film thickness of the etching mask film 25 is preferably not more than 15 nm from the viewpoint of reducing film thickness of the resist film.

In the case the uppermost surface of the reflective mask blank 30 of the present invention is the etching mask film 25, similar to the case of the uppermost surface of the reflective mask blank 30 being the absorber film 24, the root mean square roughness (Rms), obtained by measuring a 3 µm×3 µm region on the surface of the etching mask film 25 with an atomic force microscope, and the power spectrum density at a spatial frequency of 1 $\mu m^{-1}$ to 10 $\mu m^{-1}$, can be made to be within the prescribed ranges of values. According to the reflective mask blank 30 of the present invention having such a configuration, the detection of pseudo defects attributable to surface roughness of a substrate or film in a defect inspection using a highly sensitive defect inspection apparatus can be inhibited, and the discovery of contaminants or scratches and other critical defects can be facilitated.

The following provides an explanation of a method of manufacturing the reflective mask blank 30 of the present invention.

The present invention is a method of manufacturing the reflective mask blank 30 having the mask blank multilayer film 26, comprising the multilayer reflective film 21, obtained by mutually laminating a high refractive index layer and a low refractive index layer, and the absorber film 24, on a main surface of the mask blank substrate 10. The method of manufacturing the reflective mask blank 30 of the present invention comprises a step for forming the multilayer reflective film 21 on a main surface of the mask blank substrate 10, and a step for forming the absorber film 24 on the multilayer reflective film 21. In the method of manufacturing the reflective mask blank 30 of the present invention, the absorber film 24 is formed so that the surface of the reflective mask blank 30 has a root mean square roughness (Rms), obtained by measuring a 3 µm×3 µm region with an atomic force microscope, of not more than 0.5 nm, and has a power spectrum density at a spatial frequency of 1 $\mu m^{-1}$ to 10 $\mu m^{-1}$ of not more than 50 $nm^4$.

On the surface of the reflective mask blank 30 of the present invention, by making Rms to not be more than 0.5 nm (preferably not more than 0.45 nm, more preferably not more than 0.40 nm, and even more preferably not more than 0.35 nm), and making the power spectrum density, which is the amplitude intensity of all roughness components detectable in a 3 µm×3 µm region at a spatial frequency of 1 $\mu m^{-1}$ to 10 $\mu m^{-1}$, to not be more than 50 $nm^4$ (preferably not more than 45 $nm^4$, more preferably not more than 40 $nm^4$ and even more preferably not more than 35 $nm^4$), the reflective mask blank 30 can be fabricated in which the detection of pseudo defects in a defect inspection using a highly sensitive defect inspection apparatus can be inhibited, and critical defects can be made more conspicuous.

In the method of manufacturing the reflective mask blank 30 of the present invention, in the step for forming the absorber film 24, the absorber film 24 is formed by reactive sputtering using a sputtering target composed of a material contained in the absorber film 24, and the absorber film 24 is preferably formed so that a component contained in the atmospheric gas during reactive sputtering is contained therein. The root mean square roughness (Rms) and the power spectrum density, which is the amplitude intensity of all roughness components detectable in a 3 µm×3 µm region at a spatial frequency of 1 $\mu m^{-1}$ to 10 $\mu m^{-1}$, of the surface of the mask blank multilayer film 26 can be adjusted so as to be within the ranges of prescribed values by adjusting the flow rate of atmospheric gas during deposition by reactive sputtering.

In the case of forming the absorber film 24 by reactive sputtering, the atmospheric gas is preferably a mixed gas containing an inert gas and nitrogen gas. In this case, since the flow rate of nitrogen can be adjusted, the absorber film 24 can be obtained having a suitable composition. As a result, the absorber film 24 having a suitable root mean square roughness (Rms) and power spectrum density can be reliably obtained on the surface of the mask blank multilayer film 26.

In the method of manufacturing the reflective mask blank 30 of the present invention, the absorber film 24 is preferably formed using a sputtering target of a material containing tantalum. As a result, the absorber film 24 that contains tantalum and has suitable absorption of exposure light can be obtained.

In the method of manufacturing the reflective mask blank 30 of the present invention, in the step for forming the absorber film 24, the absorber film 24 is formed by sputtering using a sputtering target of an absorber film material, and materials and composition are selected so that the surface of the absorber film 24 has a root mean square roughness (Rms) of not more than 0.5 nm and a power spectrum density of not more than 50 $nm^4$. The material of the aforementioned absorber film 24 is selected from the previously exemplified materials, and the film thickness of the absorber film 24 is set to a film thickness required to have a desired reflectance difference between light reflected by the multilayer reflective film 21 and the protective film 22 and light reflected by the absorber pattern 27. The film thickness of the absorber film 24 is preferably set to a range of not more than 60 nm.

The method of manufacturing the reflective mask blank 30 of the present invention preferably further comprises a step for forming the protective film 22 arranged in contact with the surface of the multilayer reflective film 21. Since damage to the surface of the multilayer reflective film 21 can be inhibited when fabricating a transfer mask (EUV mask) by forming the protective film 22, reflectance properties with respect to EUV light can be further improved. In addition, in the manufactured reflective mask blank 30, detection of pseudo defects on the surface of the protective film 22 in a defect inspection using a highly sensitive defect inspection apparatus can be inhibited, thereby making it possible to make critical defects more conspicuous.

The protective film 22 is preferably formed by ion beam sputtering in which a sputtering target of the material of the protective film 22 is irradiated with an ion beam. Since smoothing of the protective film surface is obtained by ion beam sputtering, the surface of the absorber film formed on the protective film and an etching mask film further formed on the absorber film can be smoothened.

The method of manufacturing the reflective mask blank 30 of the present invention preferably further comprises a step for forming the etching mask 25 arranged in contact with the surface of the absorber film 24. By forming the etching mask film 25 to have different dry etching properties than those of the absorber film 24, a highly precise transfer pattern can be formed when forming a transfer pattern on the absorber film 24.

[Reflective Mask 40]

The following provides an explanation of the reflective mask 40 according to one embodiment of the present invention.

Figure 4:
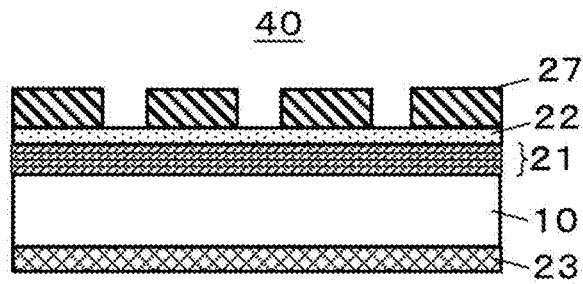
FIG. 4 is a cross-sectional schematic diagram showing one example of a reflective mask according to one embodiment of the present invention.

FIG. 4 is a schematic diagram showing the reflective mask 40 of the present embodiment.

The reflective mask 40 of the present invention employs a configuration in which the absorber pattern 27 is formed on the aforementioned multilayer reflective film 21 or the aforementioned protective film 22 by pattering the absorber film 24 on the aforementioned reflective mask blank 30. When the reflective mask 40 of the present embodiment is exposed with exposure light such as EUV light, the exposure light is absorbed at the portion of the mask surface where the absorber film 24 is present, and the exposure light is reflected by the exposed protective film 22 and the multilayer reflective film 21 at other portions where the absorber film 24 has been removed. Therefore, the reflective mask 40 of the present embodiment can be used as a reflective mask 40 for lithography. According to the reflective mask 40 of the present invention, detection of pseudo defects in a defect inspection using a highly sensitive defect inspection apparatus can be inhibited and critical defects can be made more conspicuous.

[Method of Manufacturing Semiconductor Device]

A semiconductor device, having various transfer patterns formed on a transferred substrate such as a semiconductor substrate, can be manufactured by transferring a transfer pattern, such as a circuit pattern based on the absorber pattern 27 of the reflective mask 40, to a resist film formed on a transferred substrate such as a semiconductor substrate by using the previously explained reflective mask 40 and a lithography process using an exposure apparatus, followed by going through various other steps.

According to the method of manufacturing a semiconductor device of the present invention, since the reflective mask 40, which contaminants, scratches and other critical defects have been removed, can be used in a defect inspection using a highly sensitive defect inspection apparatus, there are no defects in the transfer pattern such as a circuit pattern transferred to a resist film formed on a transferred substrate such as a semiconductor substrate, and a semiconductor device can be manufactured having a fine and highly precise transfer pattern.

Furthermore, fiducial marks can be formed on the previously described mask blank substrate 10, the substrate with a multilayer reflective film 20 or the reflective mask blank 30, and the coordinates of the locations of these fiducial marks and critical defects detected with a highly sensitive defect inspection apparatus as previously described can be managed. When fabricating the reflective mask 40 based on the resulting critical defect location information (defect data), drawing data can be corrected and defects can be reduced so that the absorber pattern 27 is formed at those locations where critical defects are present based on the aforementioned defect data and transferred pattern (circuit pattern) data.

EXAMPLES

The following provides an explanation of examples of manufacturing the reflective mask blank 30 and the reflective mask 40 according to the present embodiment.

First, the multilayer reflective film 21 and the absorber film 24 were deposited on the surface of the mask blank substrate 10 for EUV exposure in the manner described below to manufacture the substrate with a multilayer reflective film 20 of Example Samples 1 to 5 and Comparative Example Samples 1 to 4.

<Fabrication of Mask Blank Substrate 10>

An $SiO_2$—$TiO_2$-based glass substrate having a size of 152 mm×152 mm and a thickness of 6.35 mm was prepared for use as the mask blank substrate 10, and the front and back surfaces of the glass substrate were sequentially polished with cerium oxide abrasive particles and colloidal silica abrasive particles using a double-sided polishing apparatus followed by treating the surfaces with a low concentration of hydrofluorosilicic acid. Measurement of the surface roughness of the resulting glass substrate surface with an atomic force microscope yielded a root mean square roughness (Rms) of 0.5 nm.

The surface morphology (surface form, flatness) and total thickness variation (TTV) of regions measuring 148 mm×148 mm on the front and back surfaces of the glass substrate were measured with a wavelength-shifting interferometer using a wavelength-modulating laser. As a result, the flatness of the front and back surfaces of the glass substrate was 290 nm (convex shape). The results of measuring the surface morphology (flatness) of the glass substrate surface were stored in a computer in the form of height information with respect to a reference surface for each measurement point, compared with a reference value of 50 nm (convex shape) for the flatness of the front surface and a reference value of 50 nm for the flatness of the back side required by glass substrates, and the differences therewith (required removal amounts) were calculated by computer.

Next, processing conditions for local surface processing were set corresponding to the required removal amounts for each processing spot-shaped region on the surface of the glass substrate. A dummy substrate was used and preliminarily processed at a spot in the same manner as actual processing without moving the substrate for a fixed period of time, the morphology thereof was measured with the same measuring instrument as the apparatus used to measure the surface morphology of the aforementioned front and back surfaces, and the processing volume of the spot per unit time was calculated. The scanning speed during Raster scanning of the glass substrate was then determined in accordance with the required removal amount obtained from the spot information and surface morphology information of the glass substrate.

Surface morphology was adjusted by carrying out local surface processing treatment in accordance with the set processing conditions by magnetorheological finishing (MRF) using a substrate finishing apparatus employing a magnetorheological fluid so that the flatness of the front and back surfaces of the glass substrate was not more than the aforementioned reference values. Furthermore, the magnetorheological fluid used at this time contained an iron component, and the polishing slurry used an alkaline aqueous solution containing about 2% by weight of an abrasive in the form of cerium oxide. Subsequently, the glass substrate was immersed in a cleaning tank containing an aqueous hydrochloric acid solution having a concentration of about 10% (temperature: about 25° C.) for about 10 minutes followed by rinsing with pure water and drying with isopropyl alcohol (IPA).

Furthermore, the local processing method employed for the mask blank substrate 10 in the present invention is not limited to the aforementioned magnetorheological finishing. A processing method using gas cluster ion beams (GCIB) or localized plasma may also be used.

Subsequently, surface processing by catalyst-referred etching (CARE) was carried out after carrying out double-sided touch polishing using colloidal silica abrasive particles as the finishing polishing of local surface processing treatment for the purpose of improving surface roughness. This CARE was carried out under the processing conditions indicated below.

Machining fluid: Pure water
Catalyst: Platinum
Substrate rotating speed: 10.3 rpm
Catalyst surface plate rotating speed: 10 rpm
Processing time: 50 minutes
Processing pressure: 250 hPa Subsequently, after scrubbing the edge faces of the glass substrate, the glass substrate was immersed in a cleaning tank containing aqua regia (temperature: about 65° C.) for about 10 minutes followed by rinsing with pure water and drying. Furthermore, cleaning with aqua regia was carried out several times until there was no longer any Pt catalyst residue on the front and back surfaces of the glass substrate.

When a 1 μm×1 μm region at an arbitrary location of the transfer pattern formation region (132 mm×132 mm) on a main surface of the mask blank substrate 10 for EUV exposure obtained in the manner described above was measured with an atomic force microscope, root mean square roughness (Rms) was determined to be 0.040 nm and maximum height (Rmax) was determined to be 0.40 nm.

The power spectrum density at a spatial frequency of 1 $\mu m^{-1}$ to 10 $\mu m^{-1}$ obtained by measuring a 1 μm×1 μm region on a main surface of the mask blank substrate 10 for EUV exposure obtained in the manner described above with an atomic force microscope was a maximum of 5.29 $nm^4$ and a minimum of 1.15 $nm^4$. In addition, the power spectrum density at a spatial frequency of 10 $\mu m^{-1}$ to 100 $\mu m^{-1}$ was a maximum of 1.18 $nm^4$ and a minimum of 0.20 $nm^4$. Thus, the power spectrum density of a main surface of the aforementioned mask blank substrate 10 at a spatial frequency of not less than 1 $\mu m^{-1}$ and at a spatial frequency of 1 $\mu m^{-1}$ to 10 $\mu m^{-1}$ can be said to have been not more than 10 $nm^4$.

A 132 mm×132 mm region on a main surface of the aforementioned mask blank substrate 10 for EUV exposure was inspected for defects using a highly sensitive defect inspection apparatus having an inspection light source wavelength of 193 nm ("Teron 610" manufactured by KLA-Tencor Corp.) under inspection sensitivity conditions that enabled detection of defects having a size of 21.5 nm in terms of sphere equivalent volume diameter (SEVD). As a result, the total number of defects, including pseudo defects, detected was 370, and pseudo defects were inhibited significantly in comparison with the more than 50,000 defects conventionally detected. A number of detected defects of this degree (370 total defects detected) enables the presence of contaminants, scratches or other critical defects to be inspected easily.

In addition, as a result of inspecting a 132 mm×132 mm region on a main surface of the aforementioned mask blank substrate 10 for EUV exposure for defects using a highly sensitive defect inspection apparatus having an inspection light source wavelength of 266 nm ("MAGICS M7360" manufactured by Lasertec Corp.) under the most sensitive inspection conditions, the number of defects, including pseudo defects, was less than 50,000 in all cases, thereby enabling inspection of critical defects.

Example Samples 1 to 5 and Comparative Example Samples 1 to 4

The multilayer reflective film 21 was formed on the previously described glass substrate by alternately laminating an Mo layer (low refractive index layer, thickness: 2.8 nm) and an Si layer (high refractive index layer, thickness: 4.2 nm) (for a total of 40 laminated pairs) by ion beam sputtering using an Mo target and Si target. When depositing the multilayer reflective film 21 by ion beam sputtering, the incident angle of sputtered Mo and Si particles relative to the normal of a main surface of the glass substrate in ion beam sputtering was 30 degrees and ion source gas flow rate was 8 sccm.

After depositing the multilayer reflective film 21, an Ru protective film 22 (film thickness: 2.5 nm) was deposited by ion beam sputtering on the multilayer reflective film 21 in continuation therefrom to obtain the substrate with a multilayer reflective film 20. When depositing the Ru protective film 22 by ion beam sputtering, the incident angle of Ru sputtered particles relative to the normal of a main surface of the substrate was 40 degrees and the ion source gas flow rate was 8 sccm.

Next, the absorber film 24 was deposited on a main surface of the previously described mask blank substrate 10 by DC magnetron sputtering. In the case of Example Samples 1 to 4 and Comparative Example Samples 1 to 3, a single layer of a TaN film was used for the absorber film 24 as indicated in Table 1. In the case of Example Sample 5 and Comparative Example Sample 4, a multilayer film composed of two layers consisting of an absorbing layer in the form of a TaBN film and a low reflecting layer in the form of a TaBO film was used for the absorber film 24 as indicated in Table 2.

The method used to deposit the absorber film 24 (TaN film) of Example Samples 1 to 4 and Comparative Example Samples 1 to 3 is as described below. Namely, a TaN film was deposited on a main surface of the previously described mask blank substrate 10 by DC magnetron sputtering. More specifically, a Ta target (multi-axis rolled target) was placed in opposition to a main surface of the mask blank substrate 10, and reactive sputtering was carried out in a mixed gas atmosphere of Ar gas and $N_2$ gas. Table 1 indicates the flow rates of Ar gas and $N_2$ gas and other deposition conditions during deposition of the TaN films of Example Samples 1 to 4 and Comparative Example Samples 1 to 3. Following deposition, elementary compositions of the TaN films were measured by X-ray photoelectron spectroscopy (XPS). Table 1 indicates the elementary compositions of the TaN films of Example Samples 1 to 4 and Comparative Example Samples 1 to 3 as measured by XPS along with the film thicknesses of the TaN films. Furthermore, when the crystal structure of the aforementioned TaN films was measured with an X-ray diffraction (XRD) analyzer, they were determined to have a microcrystalline structure. The absorber films 24 (TaN films) of Example Samples 1 to 4 and Comparative Example Samples 1 to 3 were deposited in the manner described above.

The method used to deposit the absorber film 24 (multilayer film composed of two layers consisting of an absorbing layer in the form of a TaBN film and a low reflecting layer in the form of a TaBO film) of Example Sample 5 and Comparative Example Sample 4 is as described below. Namely, an absorbing layer in the form of a TaBN film was deposited by DC magnetron sputtering on the surface of the protective film 22 of the substrate with a multilayer reflective film 20 that was previously described. This TaBN film was deposited by placing the substrate with a multilayer reflective film 20 in opposition to a TaB mixed sintered target (Ta:B=80:20, atomic ratio) and carrying out reactive sputtering in a mixed gas atmosphere of Ar gas and $N_2$ gas. Table 2 indicates the flow rates of Ar gas and $N_2$ gas and other deposition conditions during deposition of the TaBN films of Example Sample 5 and Comparative Example Sample 4. Following deposition, elementary compositions of the TaBN films were measured by X-ray photoelectron spectroscopy (XPS). Table 2 indicates the elementary compositions of the TaBN films of Example Sample 5 and Comparative Example Sample 4 as measured by XPS along with the film thicknesses of the TaBN films. Furthermore, when the crystal structure of the aforementioned TaBN films was measured with an X-ray diffraction (XRD) analyzer, they were determined to have an amorphous structure.

In the Example Sample 5 and Comparative Example Sample 4, a TaBO film (low reflecting layer) containing Ta, B and O was then further formed on the TaBN film by DC magnetron sputtering. Similar to the TaBN film of the first film, this TaBO film was deposited by placing the substrate with a multilayer reflective film 20 in opposition to a TaB mixed sintered target (Ta:B=80:20, atomic ratio) and carrying out reactive sputtering in a mixed gas atmosphere of Ar and $O_2$. Table 2 indicates the flow rates of Ar gas and $O_2$ gas and other deposition conditions during deposition of the TaBO films of Example Sample 5 and Comparative Example Sample 4. Following deposition, elementary compositions of the TaBO films were measured by X-ray photoelectron spectroscopy (XPS). Table 2 indicates the elementary compositions of the TaBO films of Example Sample 5 and Comparative Example Sample 4 as measured by XPS along with the film thicknesses of the TaBO films. Furthermore, when the crystal structure of the aforementioned TaBO films was measured with an X-ray diffraction (XRD) analyzer, they were determined to have an amorphous structure. The absorber films 24 (laminated films) of Example Sample 5 and Comparative Example Sample 4 were deposited in the manner described above.

TABLE 1

|  | Example Sample 1 | Example Sample 2 | Example Sample 3 | Example Sample 4 | Comparative Example Sample 1 | Comparative Example Sample 2 | Comparative Example Sample 3 |
|---|---|---|---|---|---|---|---|
| Target material | Ta | Ta | Ta | Ta | Ta | Ta | Ta |
| Deposition gas Ar (sccm) | 20 | 39 | 30 | 20 | 20 | 1 | 40 |
| $N_2$ (sccm) | 33 | 8 | 20 | 33 | 33 | 60 | 5 |
| Film composition (XPS) | TaN film | TaN film | TaN film | TaN film | TaN film | TaN film | TaN film |
| Ta (at %) | 50 | 85 | 70 | 50 | 50 | 42 | 92 |
| N (at %) | 50 | 15 | 30 | 50 | 50 | 58 | 8 |
| Film thickness (nm) | 100 | 100 | 100 | 50 | 200 | 100 | 100 |
| Rms (nm) | 0.365 | 0.334 | 0.293 | 0.272 | 0.553 | 1.062 | 0.473 |
| Maximum value of PSD (range of 1 $\mu m^{-1}$ to 10 $\mu m^{-1}$) ($nm^4$) | 39.0 | 36.2 | 31.5 | 29.8 | 114.7 | 197.4 | 53.9 |
| Integrated value of PSD (range of 1 $\mu m^{-1}$ to 10 $\mu m^{-1}$) ($\times 10^{-3}$ $nm^3$) | 497.34 | 475.03 | 452.86 | 439.29 | 1945.54 | 3020.11 | 968.72 |
| No. of defects detected (number) | 13204 | 10508 | 9878 | 7014 | >100000 | >100000 | 71372 |

TABLE 2

|  |  | Example Sample 5 | Comparative Example Sample 4 |
|---|---|---|---|
| Absorbing layer | Target material | TaB mixed sintered target (Ta:B = 80:20, atomic ratio) | TaB mixed sintered target (Ta:B = 80:20, atomic ratio) |
|  | Deposition gas  Ar (sccm) | 12.4 | 12.4 |
|  | $N_2$ (sccm) | 6.0 | 6.0 |
|  | Film composition (XPS) | TaBN layer | TaBN layer |
|  | Ta (at %) | 74.7 | 74.1 |
|  | B (at %) | 12.1 | 12.2 |
|  | N (at %) | 13.2 | 13.7 |
|  | Film thickness (nm) | 56 | 186 |
| Low reflecting layer | Target material | (Same as first film) | (Same as first film) |
|  | Deposition gas  Ar (sccm) | 57.0 | 57.0 |
|  | $O_2$ (sccm) | 28.6 | 28.6 |
|  | Film composition (XPS) | TaBO layer | TaBO layer |
|  | Ta (at %) | 40.7 | 40.6 |
|  | B (at %) | 6.3 | 6.2 |
|  | O (at %) | 53.0 | 53.2 |
|  | Film thickness (nm) | 14 | 14 |
| Total film thickness (nm) |  | 70 | 200 |
| Rms (nm) |  | 0.496 | 0.536 |
| Maximum value of PSD (range of 1 $\mu m^{-1}$ to 10 $\mu m^{-1}$) ($nm^4$) |  | 46.3 | 44.6 |
| Integrated value of PSD (range of 1 $\mu m^{-1}$ to 10 $\mu m^{-1}$) ($\times 10^{-3}$ $nm^3$) |  | 752.29 | 875.64 |
| No. of defects detected (number) |  | 18572 | 58113 |

Regions measuring 3 μm×3 μm at an arbitrary location in the transfer pattern formation regions (and more specifically, in the centers of the transfer pattern formation regions) (132 mm×132 mm) were measured with an atomic force microscope for the surfaces of the absorber films 24 of the mask blank substrates 10 for EUV exposure obtained in the form of Example Samples 1 to 5 and Comparative Example Samples 1 to 4. Tables 1 and 2 indicate the maximum values of surface roughness (root mean square roughness: Rms) obtained by measuring with an atomic force microscope, and power spectrum density at a spatial frequency of 1 $\mu m^{-1}$ to 10 $\mu m^{-1}$ as determined by power spectrum analysis of surface roughness.

Figure 6:
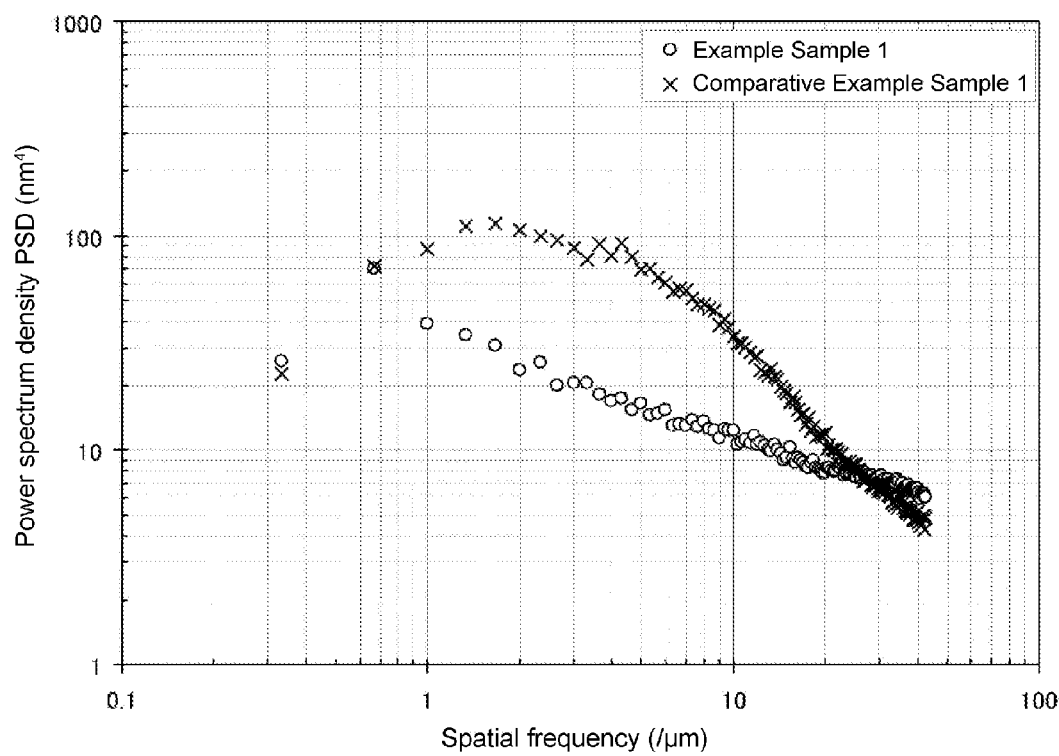
FIG. 6 is a graph indicating the results of analyzing the power spectra of the surfaces of absorber films of reflective mask blanks of an Example Sample 1 and Comparative Example Sample 1 of the present invention.

For reference purposes, FIG. 6 indicates the results of analyzing the power spectra of Example Sample 1 and Comparative Example Sample 1. As shown in FIG. 6, the power spectrum density at a spatial frequency of 1 $\mu m^{-1}$ to 10 $\mu m^{-1}$ obtained by measuring a 3 μm×3 μm region on the surface of the TaN film of Example Sample 1 with an atomic force microscope demonstrated a maximum value of 39.0 $nm^4$ and a minimum value of 11.4 $nm^4$. On the other hand, as is also shown in FIG. 6, the power spectrum density at a spatial frequency of 1 $\mu m^{-1}$ to 10 $\mu m^{-1}$ obtained by measuring a 3 μm×3 μm region on the surface of the TaN film of Comparative Example Sample 1 with an atomic force microscope demonstrated a maximum value of 114.7 $nm^4$ and a minimum value of 34.0 $nm^4$.

As indicated in Tables 1 and 2, the root mean square roughness (Rms) obtained by measuring a 3 μm×3 μm region on the surface of the absorber film 24 of Example Samples 1 to 5 with an atomic force microscope was not more than 0.5 nm. On the other hand, the root mean square roughness (Rms) obtained by measuring a 3 μm×3 μm region on the surface of the absorber film 24 of Comparative Example Samples 1, 2 and 4 with an atomic force microscope was greater than 0.5 nm.

As is indicated in Tables 1 and 2, the maximum value of power spectrum density at a spatial frequency of 1 $\mu m^{-1}$ to 10 $\mu m^{-1}$ of the surface of the absorber film 24 of Example Samples 1 to 5 was not more than 50 $nm^4$. On the other hand, the maximum value of power spectrum density at a spatial frequency of 1 $\mu m^{-1}$ to 10 $\mu m^{-1}$ of the surface of the absorber film 24 of Comparative Example Samples 1 to 3 was greater than 50 $nm^4$.

Regions measuring 132 mm×132 mm on the surface of the absorber film 24 of Example Samples 1 to 5 and Comparative Example Samples 1 to 4 were inspected for detects under inspection sensitivity conditions enabling detection of defects having a sphere equivalent volume diameter (SEVD) of 21.5 nm using a highly sensitive defect inspection apparatus having an inspection light source wavelength of 193 nm ("Teron 610" manufactured by KLA-Tencor Corp.). Furthermore, sphere equivalent volume diameter (SEVD) can be calculated according to the equation: $SEVD = 2(3S/4\pi h)^{1/3}$ when defining (S) to be the area of the defect and defining (h) to be the defect height. Defect area (S) and defect height (h) can be measured with an atomic force microscope (AFM).

Tables 1 and 2 indicate the number of defects detected, including pseudo defects, in the surface of the absorber films 24 of Example Samples 1 to 5 and Comparative Example Samples 1 to 4 as determined by measuring the sphere equivalent volume diameter (SEVD). The maximum total number of defects detected in Example Samples 1 to 5 was 18,572 (Example Sample 5), indicating that the number of pseudo defects was significantly inhibited in comparison with the more than 50,000 defects conventionally detected. A total of 18,572 detected defects means that the presence or absence of contaminants, scratches and other critical defects can be inspected easily. In contrast, the minimum total number of defects detected in Comparative Example Samples 1 to 4 was 58,111 (Comparative Example Sample 4), indicating that inspections were unable to be carried out for the presence or absence of contaminants, scratches or other critical defects.

<Fabrication of Reflective Mask Blank 30: Examples 1 and 2 and Comparative Examples 1 and 2>

Reflective mask blanks 30 of Examples 1 and 2 and Comparative Examples 1 and 2 were fabricated under the conditions shown in Table 3. Namely, similar to the cases of Example Samples 1 to 5 and Comparative Example Samples 1 to 4, the multilayer reflective film 21 was formed on the surface of the mask blank substrate 10 for EUV exposure. Subsequently, the protective film 22 was deposited on the surface of the multilayer reflective film 21, and the absorber film 24 shown in Table 3 was deposited on the protective film 22. Moreover, the back side electrically conductive film 23 was deposited on the mask blank substrate 10 to fabricate the reflective mask blanks 30 of Examples 1 and 2 and Comparative Examples 1 and 2.

TABLE 3

|  | Example 1 | Example 2 | Comparative example 1 | Comparative example 2 |
| --- | --- | --- | --- | --- |
| Absorber film | Same as Example Sample 3 (TaN film) | Same as Example Sample 5 (TaBN layer/TaBO layer) | Same as Comparative Example Sample 2 (TaN film) | Same as Comparative Example Sample 3 (TaN film) |
| Absorber film thickness (nm) | 85 | 85 | 85 | 85 |
| Back side electrically conductive film | CrN film | CrN film | CrN film | CrN film |
| Back side electrically conductive film thickness (nm) | 20 | 20 | 20 | 20 |
| Rms (nm) | 0.285 | 0.498 | 0.98 | 0.459 |
| Maximum value of PSD (range of 1 $\mu m^{-1}$ to 10 $\mu m^{-1}$) ($nm^4$) | 30.7 | 46.9 | 178.2 | 52.1 |
| Integrated value of PSD (range of 1 $\mu m^{-1}$ to 10 $\mu m^{-1}$) ($\times 10^{-3}$ $nm^3$) | 450.56 | 768.21 | 2547.30 | 939.48 |
| No. of defects detected (number) | 8570 | 19986 | >100000 | 69950 |

Furthermore, fiducial marks for managing coordinates of the locations of the aforementioned defects were formed with a focused ion beam at 4 locations outside the transfer pattern formation region (132 mm×132 mm) on the protective film 22 and the multilayer reflective film 21 of the substrate with a multilayer reflective film 20 used in Examples 1 and 2 and Comparative Examples 1 and 2.

The back side electrically conductive film 23 was formed in the manner described below. Namely, the back side electrically conductive film 23 was formed by DC magnetron sputtering on the back side of the substrate with a multilayer reflective film 20 used in Examples 1 and 2 and Comparative Examples 1 and 2 where the multilayer reflective film 21 was not formed. The back side electrically conductive film 23 was formed by positioning a Cr target in opposition to the back side of the substrate with a multilayer reflective film 20 and carrying out reactive sputtering in an atmosphere consisting of a mixture of Ar and $N_2$ gas (Ar:$N_2$=90%:10%). Measurement of the elementary composition of the back side electrically conductive film 23 by Rutherford back scattering analysis yielded values of 90 at % for Cr and 10 at % for N. In addition, the film thickness of the back side electrically conductive film 23 was 20 nm. The reflective mask blanks 30 of Examples 1 and 2 and Comparative Examples 1 and 2 were fabricated in the manner described above.

Regions measuring 3 μm×3 μm at arbitrary locations of the transfer pattern formation regions (132 mm×132) (and more specifically, the centers of the transfer pattern regions) on the surfaces of the absorber films 24 of the reflective mask blanks 30 of Examples 1 and 2 and Comparative Examples 1 and 2 were measured with an atomic force microscope. Table 3 indicates the values of surface roughness (root mean square roughness, Rms) obtained by measuring with an atomic force microscope and the maximum values of power spectrum density (PSD) at a spatial frequency of 1 $\mu m^{-1}$ to 10 $\mu m^{-1}$ determined by power spectrum analysis of surface roughness.

As shown in Table 3, the root mean square roughness (Rms) obtained by measuring a 3 μm×3 μm region on the surface of the absorber film 24 of the reflective mask blanks 30 of Examples 1 and 2 with an atomic force microscope was not more than 0.5 nm. On the other hand, the root mean square roughness (Rms) obtained by measuring a 3 μm×3 μm region on the surface of the absorber film 24 of the reflective mask blank 30 of Comparative Example 1 with an atomic force microscope was greater than 0.5 nm.

As is also shown in Table 3, the maximum value of the power spectrum density at a spatial frequency of 1 $\mu m^{-1}$ to 10 $\mu m^{-1}$ of the surface of the absorber films 24 of Examples 1 and 2 was not more than 50 $nm^4$. On the other hand, the maximum value of the power spectrum density at a spatial frequency of 1 $\mu m^{-1}$ to 10 $\mu m^{-1}$ of the surface of the absorber films 24 of Comparative Examples 1 and 2 was greater than 50 $nm^4$.

Regions measuring 132 mm×132 mm on the surfaces of the absorber films 24 of Example Samples 1 to 5 and Comparative Example Samples 1 to 4 were inspected for defects using a highly sensitive defect inspection apparatus having an inspection light source wavelength of 193 nm ("Teron 610" manufactured by KLA-Tencor Corp.) under inspection sensitivity conditions that enabled detection of defects having a size of 21.5 nm in terms of sphere equivalent volume diameter (SEVD). Furthermore, sphere equivalent volume diameter (SEVD) can be calculated according to the equation: SEVD=$2(3S/4\pi h)^{1/3}$ when defining (S) to be the area of the defect and defining (h) to be the defect height. Defect area (S) and defect height (h) can be measured with an atomic force microscope (AFM).

Table 3 indicates the number of defects detected, including pseudo defects, in the surface of the absorber films 24 of Examples 1 and 2 and Comparative Examples 1 and 2 as determined by measuring the sphere equivalent volume diameter (SEVD). The maximum total number of defects detected in Examples 1 and 2 was 19,986 (Example 2), indicating that the number of pseudo defects was significantly inhibited in comparison with the more than 50,000 defects conventionally detected. A total of 19,986 detected defects means that the presence or absence of contaminants, scratches and other critical defects can be inspected easily. In contrast, the minimum total number of defects detected in Comparative Examples 1 and 2 was 69,950 (Comparative Example 2), indicating that inspections were unable to be carried out for the presence or absence of contaminants, scratches or other critical defects.

<Fabrication of Reflective Mask 40>

The surface of the absorber film 24 of the reflective mask blanks 30 of Examples 1 and 2 and Comparative Examples 1 and 2 were coated with resist by spin coating and a resist film 25 having a film thickness of 150 nm was deposited thereon after going through heating and cooling steps. Next, a resist pattern was formed by going through desired pattern drawing and developing steps. An absorber pattern 27 on the protective film 22 was formed by patterning of absorber film 24 with a prescribed dry etching using the resist pattern as a mask. Furthermore, in the case the absorber film 24 consists of a TaBN film, dry etching can be carried out with a mixed gas of $Cl_2$ and He. In addition, in the case the absorber film 24 consists of a laminated film composed of two layers consisting of a TaBN film and a TaBO film, dry etching can be carried out with a mixed gas of chlorine ($Cl_2$) and oxygen ($O_2$) (mixing ratio (flow rate ratio) of chlorine ($Cl_2$) to oxygen ($O_2$)=8:2).

Subsequently, the resist film 25 was removed followed by chemical cleaning in the same manner as previously described to fabricate the reflective masks 40 of Examples 1 and 2 and Comparative Examples 1 and 2. Furthermore, the reflective masks 40 were fabricated after correcting drawing data in the aforementioned drawing step so that the absorber pattern 27 was arranged at locations where critical defects are present based on defect data and transferred pattern (circuit pattern), and the defect data is generated in reference to the aforementioned fiduciary marks. Defect inspections were carried out on the resulting reflective masks 40 of Examples 1 and 2 and Comparative Examples 1 and 2 using a highly sensitive defect inspection apparatus ("Teron 610" manufactured by KLA-Tencor Corp.).

Defects were not confirmed during measurement with the highly sensitive defect inspection apparatus in the case of the reflective masks 40 of Examples 1 and 2. On the other hand, in the case of the reflective masks 40 of Comparative Examples 1 and 2, a large number of defects during measurement with the highly sensitive defect inspection apparatus.

<Fabrication of Reflective Mask Blank 30 Having an Absorber Film with a Phase Shift Function Formed Thereon>

The reflective mask blanks 30 of Examples 3 to 5 were fabricated under the conditions shown in Table 4. Similar to the cases of Example Samples 1 to 5 and Comparative Example Samples 1 to 4, the multilayer reflective film 21 was deposited on the surface of the mask blank substrate 10 for EUV exposure. Subsequently, the protective film 22 was deposited on the surface of the multilayer reflective film 21 and the absorber film 24 shown in Table 4 was deposited on the protective film 22. More specifically, the absorber film 24 was formed by laminating a tantalum nitride film (TaN film) and a chromium carbooxonitride film (CrCON film) by DC sputtering. The TaN films were formed in the manner indicated below. Namely, TaN films (Ta: 85 at %, N: 15 at %) having the film thicknesses described in Table 4 were formed by reactive sputtering in a mixed gas atmosphere of Ar gas and $N_2$ gas using a tantalum target. The CrCON films were formed in the manner indicated below. Namely, CrCON films (Cr: 45 at %, C: 10 at %, O: 35 at %, N: 10 at %) having the film thicknesses described in Table 4 were formed by reactive sputtering in a mixed gas atmosphere of Ar gas, $CO_2$ gas and $N_2$ gas using a chromium target. Moreover, similar to Examples 1 and 2, the reflective mask blanks 30 of Examples 3 to 5 were fabricated by depositing the back side electrically conductive film 23 on the back side of the mask blank substrate 10.

TABLE 4

|  | Example 3 | Example 4 | Example 5 |
| --- | --- | --- | --- |
| Absorber film lower layer (film thickness) | TaN (54.3 nm) | TaN (48.9 nm) | TaN (33.4 nm) |
| Absorber film upper layer (film thickness) | CrCON (5 nm) | CrCON (10 nm) | CrCON (25 nm) |
| Absorber film total thickness (nm) | 59.3 | 58.9 | 58.4 |
| EUV absolute reflectance (%) | 2.4 | 2.9 | 3.6 |
| RMS (nm) | 0.242 | 0.236 | 0.355 |
| Maximum value of PSD ($nm^4$) Range of 1 $\mu m^{-1}$ to 10 $\mu m^{-1}$ | 28.9 | 44.4 | 33.4 |
| Integrated value of PSD ($\times 10^{-3}$ $nm^3$) Range of 1 $\mu m^{-1}$ to 10 $\mu m^{-1}$ | 433.2 | 467.9 | 555.4 |
| No. of defects detected (number) | 6254 | 10094 | 25212 |

Regions measuring 3 $\mu m \times 3$ $\mu m$ in the centers of the transfer pattern formation regions on the surfaces of the absorber film 24 of the reflective mask blanks of Examples 3 to 5 were measured with an atomic force microscope, in the same manner as Examples 1 and 2. Table 4 indicates the maximum values of surface roughness (root mean square roughness: Rms) obtained by measuring with an atomic force microscope and power spectrum density (PSD) at a spatial frequency of 1 $\mu m^{-1}$ to 10 $\mu m^{-1}$ as determined by power spectrum analysis of surface roughness.

As shown in Table 4, the root mean square roughness (Rms) obtained by measuring a 3 $\mu m \times 3$ $\mu m$ region on the surface of the absorber film 24 of the reflective mask blanks 30 of Examples 3 to 5 with an atomic force microscope was favorable at not more than 0.5 nm.

In addition, the maximum value of power spectrum density at a spatial frequency of 1 $\mu m^{-1}$ to 10 $\mu m^{-1}$ of the surface of the absorber film 24 of Examples 3 to 5 was not more than 50 $nm^4$ and the integrated value was also favorable at not more than $800 \times 10^{-3}$ $nm^3$.

Next, regions measuring 132 mm×132 mm on the surface of the absorber films 24 of Examples 3 to 5 were inspected for detects under inspection sensitivity conditions enabling detection of defects having a sphere equivalent volume diameter (SEVD) of 21.5 nm using a highly sensitive defect inspection apparatus having an inspection light source wavelength of 193 nm ("Teron 610" manufactured by KLA-Tencor Corp.) in the same manner as Examples 1 and 2.

As a result, the number of defects detected on the surface of the absorber film 24 of Example 3 was the lowest at 6,254, and was followed by the absorber film 24 of Example 4 at 10,094 defects and the absorber film 24 of Example 5 at 25,212 defects, thus indicating that the number of defects detected was of a level that enables the presence or absence of contaminants, scratches or other critical defects to be inspected easily.

<Method of Manufacturing Semiconductor Device>

When semiconductor devices were fabricated using the reflective masks 40 of the aforementioned Examples 1 to 4 and Comparative Examples 1 and 2 and carrying out pattern transfer on a resist film on a transferred substrate in the form of a semiconductor substrate using an exposure apparatus followed by patterning an interconnection layer, semiconductor devices were able to be fabricated that were free of pattern defects.

Furthermore, in fabricating the previously described substrate with a multilayer reflective film 20 and the reflective mask blank 30, although the multilayer reflective film 21 and the protective film 22 were deposited on a main surface of the mask blank substrate 10 on the side where a transfer pattern is formed followed by forming the back side electrically conductive film 23 on the opposite side from the aforementioned main surface, fabrication is not limited thereto. The reflective mask blank 30 may also be fabricated by forming the back side electrically conductive film 23 on a main surface of the mask blank substrate 10 on the opposite side from the main surface on the side on which a transfer pattern is formed, followed by depositing the multilayer reflective film 21 and the protective film 22 on the main surface on the side where the transfer pattern is formed, and finally depositing the absorber film 24 on the substrate with a multilayer reflective film 20 and the protective film 22.

BRIEF DESCRIPTION OF THE REFERENCE SYMBOLS

10 Mask blank substrate
20 Substrate with a multilayer reflective film
21 Multilayer reflective film
22 Protective film
23 Back side electrically conductive film
24 Absorber film
25 Etching mask film
26 Mask blank multilayer film
27 Absorber pattern
30 Reflective mask blank
40 Reflective mask

The invention claimed is:

1. A reflective mask blank, comprising:
a mask blank multilayer film that comprises a multilayer reflective film obtained by alternately laminating a high refractive index layer and a low refractive index layer, and
an absorber film on or above a main surface of a mask blank substrate;
wherein, the root mean square roughness (Rms), obtained by measuring a 3 µm×3 µm region on a surface of the reflective mask blank on which the mask blank multilayer film is formed with an atomic force microscope, is not more than 0.5 nm and the power spectrum density at a spatial frequency of 1 µm$^{-1}$ to 10 µm$^{-1}$ is not more than 50 nm$^4$.

2. The reflective mask blank according to claim 1, wherein the mask blank multilayer film further comprises a protective film arranged in contact with a surface of the multilayer reflective film on the opposite side from the mask blank substrate.

3. The reflective mask blank according to claim 1, wherein the mask blank multilayer film further comprises an etching mask film arranged in contact with the surface of the absorber film on the opposite side from the mask blank substrate.

4. The reflective mask blank according to claim 1, wherein the absorber film comprises tantalum and nitrogen, and the nitrogen content is 10 at % to 50 at %.

5. The reflective mask blank according to claim 1, wherein the film thickness of the absorber film is not more than 60 nm.

6. The reflective mask blank according to claim 1, wherein the absorber film has a phase shift function by which the phase difference between light reflected from the surface of the absorber film and light reflected from the surface of the multilayer reflective film or protective film where the absorber film is not formed has a prescribed phase difference.

7. A reflective mask having an absorber pattern, obtained by patterning the absorber film of the reflective mask blank according to claim 1, on the multilayer reflective film.

8. A method of manufacturing a reflective mask blank having a mask blank multilayer film comprising a multilayer reflective film and an absorber film on or above a main surface of a mask blank substrate, wherein a multilayer reflective film is obtained by alternately laminating a high refractive index layer and a low refractive index layer, the method comprising:
forming the multilayer reflective film on or above the main surface of the mask blank substrate, and
forming the absorber film on or above the multilayer reflective film;
wherein, the absorber film is formed so that a surface of the reflective mask blank has a root mean square roughness (Rms), obtained by measuring a 3 µm×3 µm region with an atomic force microscope, of not more than 0.5 nm and a power spectrum density at a spatial frequency of 1 µm$^{-1}$ to 10 µm$^{-1}$ of not more than 50 nm$^4$.

9. The method of manufacturing a reflective mask blank according to claim 8, wherein, when the multilayer reflective film is formed, the multilayer reflective film is formed by ion beam sputtering by alternately irradiating a sputtering target of a high refractive index material and a sputtering target of a low refractive index material with an ion beam.

10. The method of manufacturing a reflective mask blank according to claim 8, when the absorber film is formed, the absorber film is formed by reactive sputtering using a sputtering target of an absorber film material, the absorber film is formed so as to contain a component contained in the atmospheric gas during reactive sputtering, and the flow rate of the atmospheric gas is controlled so that the root mean square roughness (Rms) is not more than 0.5 nm and the power spectrum density is not more than 50 nm$^4$.

11. The method of manufacturing a reflective mask blank according to claim 10, wherein the atmospheric gas is a mixed gas containing an inert gas and nitrogen gas.

12. The method of manufacturing a reflective mask blank according to claim 8, wherein the absorber film is formed using a sputtering target of a material containing tantalum.

13. The method of manufacturing a reflective mask blank according to claim 8, wherein, when the absorber film is formed, the absorber film is formed by sputtering using a sputtering target of a material of the absorber film, and the material and film thickness of the absorber film are selected so that the surface of the absorber film has a root mean square roughness (Rms) of not more than 0.5 nm and a power spectrum density at a spatial frequency of 1 $\mu m^{-1}$ to 10 $\mu m^{-1}$ of not more than 50 $nm^4$.

14. The method of manufacturing a reflective mask blank according to claim 13, wherein the material of the absorber film is a material that contains nitrogen, and the film thickness of the absorber film is not more than 60 nm.

15. The method of manufacturing a reflective mask blank according to claim 8, further comprising forming a protective film arranged in contact with the surface of the multilayer reflective film.

16. The method of manufacturing a reflective mask blank according to claim 15, wherein the protective film is formed by ion beam sputtering by irradiating a sputtering target of a protective film material with an ion beam.

17. The method of manufacturing a reflective mask blank according to claim 8, further comprising forming an etching mask film arranged in contact with the surface of the multilayer reflective film.

18. A method of manufacturing a semiconductor device, comprising: forming a transfer pattern on a transferred substrate by carrying out a lithography process with an exposure apparatus using the reflective mask according to claim 7.

* * * * *